(12) United States Patent
Fincham

(10) Patent No.: US 9,414,152 B2
(45) Date of Patent: Aug. 9, 2016

(54) AUDIO AND POWER SIGNAL DISTRIBUTION FOR LOUDSPEAKERS

(75) Inventor: Lawrence R. Fincham, Santa Rosa, CA (US)

(73) Assignee: THX Ltd., San Francisco, CA (US)

( * ) Notice: Subject to any disclaimer, the term of this patent is extended or adjusted under 35 U.S.C. 154(b) by 0 days.

(21) Appl. No.: 13/366,215

(22) Filed: Feb. 3, 2012

(65) Prior Publication Data

US 2013/0034251 A1   Feb. 7, 2013

Related U.S. Application Data

(63) Continuation of application No. 11/873,383, filed on Oct. 16, 2007, now Pat. No. 8,135,158.

(60) Provisional application No. 60/829,640, filed on Oct. 16, 2006.

(51) Int. Cl.
*H04R 27/00* (2006.01)
*H04R 1/40* (2006.01)
(Continued)

(52) U.S. Cl.
CPC ............... *H04R 1/403* (2013.01); *H03G 3/004* (2013.01); *H03G 3/007* (2013.01); *H04R 1/26* (2013.01); *H04R 3/12* (2013.01); *H04R 29/00* (2013.01); *H04R 2420/09* (2013.01); *H04R 2499/13* (2013.01); *H04R 2499/15* (2013.01)

(58) Field of Classification Search
USPC ......................... 381/160, 182, 387, 55, 59, 77
See application file for complete search history.

(56) References Cited

U.S. PATENT DOCUMENTS 3,371,742 A   3/1968   Norton et al. .................. 181/153
3,773,984 A   11/1973  Walker ........................... 179/111
(Continued)

FOREIGN PATENT DOCUMENTS

DE     44 10 498    10/1994
DE     44 00 435     7/1995
(Continued)

OTHER PUBLICATIONS

Yamaha Digital Home Theater Components, Natural Sound HiFi Components, 2006/2007.
(Continued)

*Primary Examiner* — Duc Nguyen
*Assistant Examiner* — George Monikang
(74) *Attorney, Agent, or Firm* — Ben J. Yorks; Irell & Manella LLP

(57) ABSTRACT

A sound reproduction system includes one or more arrays of drive units, coupled with sound processing allowing improved steerability, directional control, width control, and/or beam overlay. A speaker column may comprise two arrays facing one another, the drive units being perpendicular to the speaker unit front, with the acoustic output of each line array being compressed, turned and output from an elongate slot. The drive units may be staggered with respect to those in the opposing array. The arrays may be arc-shaped else straight. Selective delays to simulate an arced pattern. Differential delays applied to the drive units in a sub-array allow beam steering. Additional drive units, such as high frequency drivers, may be added along the length of the elongate slot or elsewhere to increase the dynamic frequency range of the speaker system. A collocated sound processor and amplifier output stage may be integrated with the speaker unit.

37 Claims, 23 Drawing Sheets

(51) Int. Cl.
*H03G 3/00* (2006.01)
*H04R 1/26* (2006.01)
*H04R 3/12* (2006.01)
*H04R 29/00* (2006.01)

(56) References Cited

U.S. PATENT DOCUMENTS

| | | | |
|---|---|---|---|
| 3,970,953 A | 7/1976 | Walker et al. | 330/84 |
| 4,029,170 A | 6/1977 | Phillips | 181/155 |
| 4,218,660 A | 8/1980 | Carver | 330/297 |
| 4,337,441 A | 6/1982 | Kellogg | 330/261 |
| 4,445,095 A | 4/1984 | Carver | 330/297 |
| 4,507,619 A | 3/1985 | Dijkstra et al. | 330/297 |
| 4,574,906 A | 3/1986 | White et al. | 381/348 |
| 4,586,002 A | 4/1986 | Carver | 330/297 |
| 4,620,317 A | 10/1986 | Anderson | 381/90 |
| 4,752,747 A | 6/1988 | Botti et al. | |
| 5,067,159 A | 11/1991 | Kasai et al. | 381/90 |
| 5,157,353 A | 10/1992 | Lendaro | 330/297 |
| 5,199,075 A | 3/1993 | Fosgate | 381/24 |
| 5,748,753 A | 5/1998 | Carver | 381/96 |
| 6,104,238 A | 8/2000 | Mattisson et al. | 329/319 |
| 6,104,248 A | 8/2000 | Carver | 330/297 |
| 6,166,605 A | 12/2000 | Carver | 330/297 |
| 6,373,335 B1 | 4/2002 | Carver | 330/10 |
| 6,373,340 B1 | 4/2002 | Shashoua | 330/297 |
| 6,459,799 B1 | 10/2002 | Smits | 381/191 |
| 6,498,521 B1 | 12/2002 | Bicakci et al. | |
| 6,636,103 B2 | 10/2003 | Wurcer et al. | |
| 7,088,827 B1 | 8/2006 | Vishwamitra | 381/1 |
| 7,254,239 B2 | 8/2007 | Fincham | 381/17 |
| 7,316,290 B2 | 1/2008 | Hutt et al. | |
| 7,515,719 B2 | 4/2009 | Hooley et al. | |
| 7,577,260 B1 | 8/2009 | Hooley et al. | |
| 7,826,622 B2 | 11/2010 | Keele, Jr. | |
| 7,834,702 B2 | 11/2010 | Jones et al. | 330/127 |
| 8,073,156 B2 | 12/2011 | Hutt et al. | |
| 8,135,143 B2 | 3/2012 | Ishibashi et al. | |
| 8,150,068 B2 | 4/2012 | Konagai et al. | |
| 8,170,223 B2 | 5/2012 | Keele, Jr. | |
| 8,170,233 B2 | 5/2012 | Horbach | |
| 8,170,263 B2 | 5/2012 | Engebretson et al. | |
| 8,189,828 B2 | 5/2012 | Takumai | |
| 8,194,863 B2 | 6/2012 | Takumai et al. | |
| 8,199,925 B2 | 6/2012 | Konagai | |
| 8,238,584 B2 | 8/2012 | Saito et al. | |
| 8,238,588 B2 | 8/2012 | Meyer et al. | |
| 2002/0089313 A1 | 7/2002 | Shashoua | 323/209 |
| 2002/0094795 A1 | 7/2002 | Mitzlaff | 455/245.1 |
| 2002/0153940 A1 | 10/2002 | Wurcer et al. | 327/536 |
| 2003/0123678 A1 | 7/2003 | Kemmerer et al. | |
| 2003/0219137 A1 | 11/2003 | Fincham | 381/302 |
| 2004/0006621 A1 | 1/2004 | Bellinson et al. | 709/225 |
| 2004/0014426 A1* | 1/2004 | Moore | H04R 3/14 455/70 |
| 2004/0049321 A1 | 3/2004 | Lehr et al. | 700/286 |
| 2004/0264707 A1 | 12/2004 | Yang et al. | |
| 2005/0129258 A1 | 6/2005 | Fincham | 381/352 |
| 2005/0259831 A1 | 11/2005 | Hutt et al. | |
| 2006/0067544 A1* | 3/2006 | Moraghan | H04R 25/502 381/113 |
| 2006/0126860 A1* | 6/2006 | Sievers et al. | 381/77 |
| 2006/0126862 A1* | 6/2006 | Andrews | H04R 5/02 381/77 |
| 2006/0126878 A1 | 6/2006 | Takumai et al. | |
| 2006/0153407 A1 | 7/2006 | Keele, Jr. et al. | 381/182 |
| 2006/0204022 A1 | 9/2006 | Hooley et al. | |
| 2007/0140513 A1* | 6/2007 | Furge | H03F 1/32 381/120 |
| 2008/0212805 A1 | 9/2008 | Fincham | |
| 2009/0129602 A1 | 5/2009 | Konagai et al. | |
| 2009/0296954 A1 | 12/2009 | Hooley et al. | |

FOREIGN PATENT DOCUMENTS

| | | | |
|---|---|---|---|
| EP | 0 969 593 | 1/2000 | |
| EP | 1071308 A2 | 1/2001 | H04R 1/28 |
| GB | 2284125 A | 5/1995 | H04R 1/40 |
| JP | 52-004202 | 1/1977 | H04R 5/00 |
| JP | 56 007504 | 1/1981 | |
| JP | 57 154913 | 9/1982 | |
| JP | 64-018396 | 1/1989 | H04R 1/28 |
| JP | 04-137994 | 5/1992 | H04R 1/20 |
| JP | 05-014993 | 1/1993 | H04R 5/02 |
| JP | 6-291561 | 10/1994 | |
| JP | 08-154300 | 6/1996 | H04S 1/00 |
| JP | 11-252698 | 9/1999 | H04S 1/00 |
| JP | 2000-078700 | 3/2000 | H04S 5/02 |
| NL | 8 601 639 | 1/1988 | |
| WO | WO 01/43276 | 6/2001 | H03F 1/02 |
| WO | WO 2008/115284 | 9/2008 | |

OTHER PUBLICATIONS

Yamaha Multi-channel surround sound enjoyment from a single component!, Digital Sound Projector YSP-1100, 2 pages, undated.

Yamaha Digital Sound Projector YSP-1000/Ysp-800, 8 pages, undated.

Yamaha multi-channel surround sound enjoyment from a single component . . . , YSP-1 Digital Sound Projector, 8 pages, undated.

Yamaha Digital Home Theater Components, Natural Sound HiFi Components, 2007, 36 pages.

Schmidmaier, Richard, et al., "Presented at the 92nd Convention Mar. 24-27, 1992 Vienna AES," An Audio Engineering Society Reprint, [2SR1.07] Preprint 3272, pp. 1-23.

Stone, Steven, "Speaker Systems, Yamaha YSP-1 Digital Sound Projector Home Theater Speaker System," Ultimate AV, Jun. 2005.

Hawksford, M. J., Dr., "Distortion Correction in Audio Power Amplifiers, Presented at the 65th Convention Feb. 25-28, 1980 London AES, An Audio Engineering Society Reprint," Preprint No. 1574 (B2), 11 pages.

Keele, D. B., et al., "Ground-Plane Constant Beamwidth Transducer (CBT) Loudspeaker Circular-Arc Line Arrays, Audio Engineering Society Convention Paper 6594," Oct. 7-10, 2005 pp. 1-47.

Walker, P.J., et al., "Current Dumping Audio Amplifier," Acoustical Mfg. Co. Ltd., Huntingdon, England, L-46, Wireless World, Feb. 1971, 5 pages.

Vanderkooy, John, et al., "Feedforward Error Correction in Power Amplifiers," Journal of the Audio Engineering Society, Jan./Feb. 1980 vol. 28, No. 1/2, pp. 2-16.

PCT Search Report and Written Opinion, from PCT/US2007/081570, THX Ltd., dated Sep. 30, 2008.

STA550, 50+50W Stereo Bash Power Amplifier, Product Review, STMicroelectronics, Jul. 2001.

STA5150, 150W Mono Bash Power Amplifier, Product Review, STMicroelectronics, Jul. 2001.

STA5100, 100W Mono Bash Power Amplifier, Product Review, STMicroelectronics, Aug. 2001.

"Understanding BCA class-I," Crown Audio Inc., 2002.

Assembling Instructions, FT326, 70W Class H Booster, Futurel, Apr. 22, 2001.

"TDA156Q; 70 W high efficiency power amplifier with diagnostic facility" Koninklijke Philips N.V., 2002.

Extended European Search Report, dated Oct. 28, 2011, EPO Patent Appln. No. 08166844.4.

Partial European Search Report, dated Jun. 21, 2011, EPO Patent Appln. No. 08166844.4.

Extended European Search Report, dated Jan. 7, 2013, EPO Patent Appln. No. 11170598.4.

D. B. Keele, Jr., The Application of Broadband Constant Beamwidth Transducer (CBT) Theory to Loudspeaker Arrays, AES 109th Convention, Los Angeles, Sep. 22-25, 2000.

(56) References Cited

OTHER PUBLICATIONS

D. B. Keele, Jr., Implementation of Straight-line and Flat-panel Constant Beamwidth Transducer (CBT) Loudspeaker Arrays Using Signal Delays, AES Convention Paper 5653 Oct. 2002.

D.B. Keele, Jr., The Full-sphere Sound Field of Constant Beamwidth Transducer (CBT) Loudspeaker Line Arrays, AES Convention Paper 114th Convention, Amsterdam, Mar. 22-25, 2003.

D.B. Keele, Jr., Practical Implementation of Constant Beamwidth Transducer (CBT) Loudspeaker Circular-Arc Line Arrays, AES Convention Paper 5863, Oct. 10-13, 2003.

"TSA Concept: Total System Architecture I", THX Product Brochure (Jan. 2004).

"New THX Technologies: Inwall/Ceiling/Home Theater Loudspeaker Application Concepts", THX Product Brochure (Jan. 2004).

* cited by examiner

Wide Beam

Narrow Beam

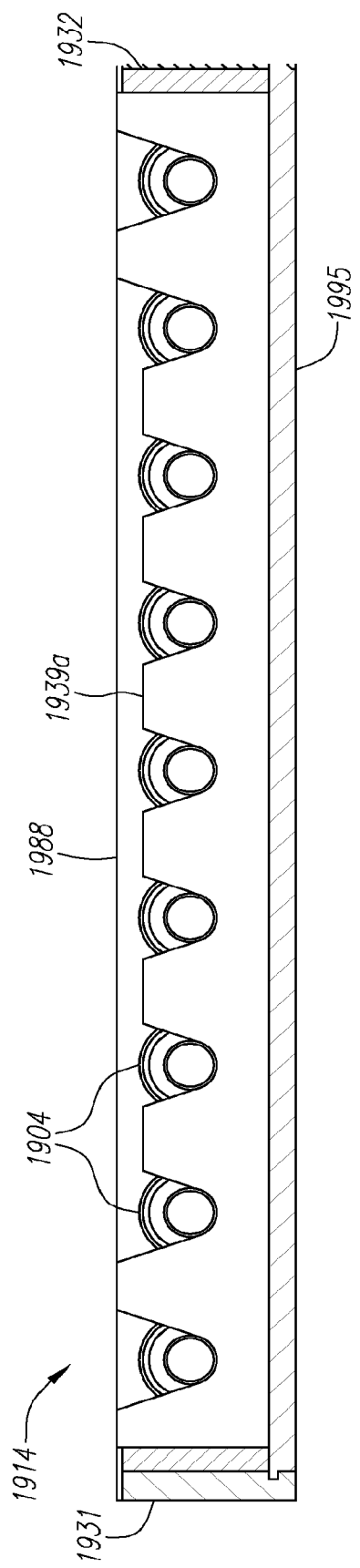
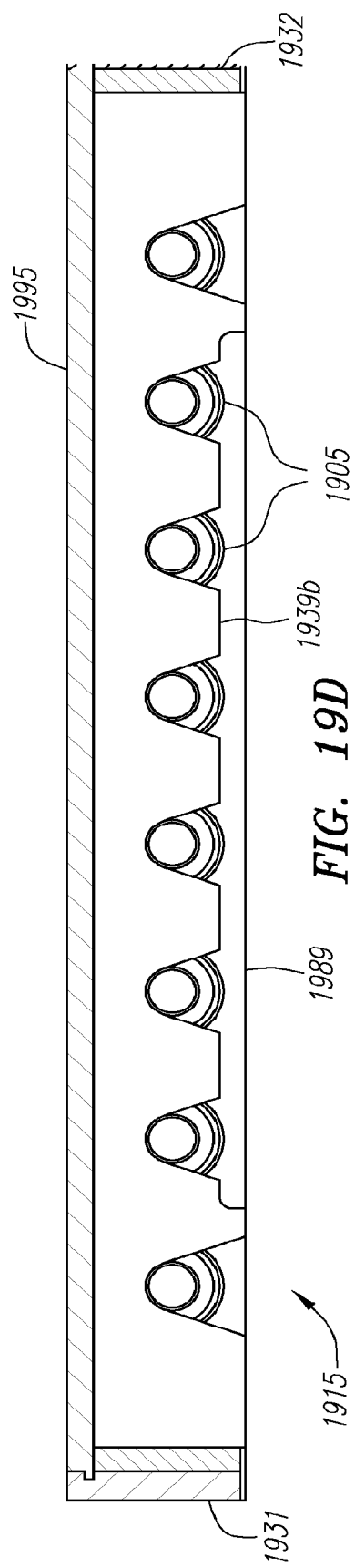
FIG. 19C
FIG. 19D

AUDIO AND POWER SIGNAL DISTRIBUTION FOR LOUDSPEAKERS

RELATED APPLICATION INFORMATION

This application is a continuation of U.S. application Ser. No. 11/873,383, filed Oct. 16, 2007, which claims the benefit of U.S. Provisional Application Ser. No. 60/829,640, filed on Oct. 16, 2006, hereby incorporated by reference as if set forth fully herein.

BACKGROUND OF THE INVENTION

1. Field of the Invention

The field of the present invention relates to sound reproduction and, more specifically, to loudspeaker array configurations and related sound processing and systems.

2. Background

Sound reproduction systems incorporating speakers are commonplace in homes, theaters, automobiles, places of entertainment, and elsewhere. The number, size, quality, characteristics, and arrangement of speakers affect sound quality in virtually any listening environment. However, many environments have constraints which limit the number, size, or type of speakers which can be used, and their arrangement. These constraints may be technical, mechanical, or aesthetic in nature.

The listening experience involves not only the speaker but also its interaction with the listening room or area. The total sound arriving at the listener has two components—direct and reflected. The direct sound provides clues as to the perceived direction of the original sources, while the indirect component increases the apparent loudness, sense of spaciousness, and general ambience. These indirect effects are mostly positive in the sense that they tend to enhance the listening experience. But reflections can also color the sound, leading to unnatural changes in timbre.

Besides the potentially undesirable effects of indirect or reflected sound, the acoustic character of the listening room or area can be sufficiently obtrusive so as to mask the natural sound quality of the original source material. For example, at low frequencies, standing waves in a listening area may cause some low frequencies to be emphasized more than others, especially in domestic-sized living rooms. The resulting bass sound is often boomy and very position dependant.

Careful placement of the speakers can reduce some of the aforementioned problems, but typically provides a satisfying listening experience only within a limited area or "sweet spot." Such a limited solution may have been acceptable in the past, when the audience for critical listening was limited to only one or two at a time. But this is seldom true today, when the sound source is usually multi-channel, more often than not accompanied by a picture, and with many more listeners seated informally over a much wider area.

With traditional stereo playback, the illusion of a continuous sound stage can be created between the two speakers when the listener is seated symmetrically in front of them. However, in practice, only those original sources positioned exactly in line with the speakers can be precisely located, while those between the speakers, often known as "phantom sources," depend on the listener being equidistant from both. Any movement of the listener away from a position of symmetry will generally cause the phantom image to flop to the nearest speaker, thus destroying the stereo illusion.

The introduction of a center channel speaker, originally for film soundtracks, was intended to eliminate this effect and keep the dialog at stage centre. This it does, but often at the expense of narrowing the front soundstage. For this reason many critical listeners of multi-channel audio source material often prefer to omit the center speaker, even if it means a more restricted sweet spot.

Besides the potential problems caused by the shape or characteristics of the listening environment, additional difficulties may be presented by the nature of the speakers being used to reproduce the sound. Even well-designed speakers, having a smooth level axial frequency response, can often have an unnatural timbre or colored sound due to reflections from nearby surfaces. For this reason, the off-axis response as well as the direct sound from the speaker is desired to be both be smooth and well controlled. However, the problem of achieving well-controlled directivity in loudspeakers has proved difficult to solve. Speakers with some measure of directional control, such as horn-loaded speakers, have routinely been used in the cinema, although their continued use owes as much to their higher efficiency as it does to their ability to have a controlled directional response.

One downside to using horn speakers is that they distort at high levels due to the non-linearity of the air at the mouth of the horn. Additionally, their inability to maintain constant directivity over a wide frequency range typically requires the use of multiple horn speakers, each covering a different part of the audio spectrum. Low-frequency horns are extremely large and as a consequence are rarely used. For reproduction of the low frequencies it is common to employ more conventional direct radiator speaker systems.

Another well known type of speaker system with some measure of controlled directivity, also used for sound reinforcement purposes, is the so-called column speaker. A column speaker consists of a long line of closely spaced identical speaker drive units that can provide a degree of directionality in the vertical plane when placed upright. Longer lines permit greater directional control at lower frequencies, with the limit of directional control being generally set by relationship between the line length and the wavelength of sound at the lowest frequency of interest. The longer the line, the lower the frequency of beam control can be. The spacing between the drivers generally limits the upper frequency for control. A two-dimensional array, with both rows and columns of speaker drive units, is capable of providing control in all directions. The design of such systems is difficult, and its implementation is very expensive in general. Moreover, not until relatively recently has the processing power needed to provide good directional control over a wide frequency range been viable. The design of suitable transducers for inclusion in such an array is another matter altogether. Meeting the dual driver-design requirements of close spacing, for accurate high-frequency control, and the need for a large effective radiating area for good bass output are not inconsiderable. Existing speaker systems which purport to achieve some form of directional control use miniature drivers that are neither small enough for high-frequency control nor large enough for adequate bass output.

Coupled with the aforementioned challenges is the fact that, in many environments, it is desirable to minimize the visual impact of loudspeakers. One technique, for example, is to color or otherwise decorate the protective speaker faceplate to match the surrounding wall or object in which the drive unit in placed, or to hide the speakers behind an artificial painting. These types of solutions may not be satisfactory for all consumers, and may limit the possibilities for optimal speaker placement as well.

One technique that has been proposed for a type of speaker column having certain desirable characteristics relates so a so-called Constant Beamwidth Transducer (CBT) array. FIG.

1 is a diagram showing an oblique view of an example of a curved speaker line array 100, also known as a Constant Beamwidth Transducer (CBT) array, as known in the art. As illustrated in FIG. 1, the curved speaker line array 100, or CBT array, comprises a plurality of low frequency drive units 104 adjacent to a plurality of high frequency drive units 108. According to a particular technique, the CBT array 100 employs frequency-independent Legendre shading. This technique is described in more detail in, for example, D. B. Keele, Jr., "Practical Implementation of Constant Beamwidth Transducer (CBT) Loudspeaker Circular-Arc Line Arrays," 115$^{th}$ Convention of the Audio Engineering Society, Paper 5863, October 2003, hereby incorporated by reference as if set forth fully herein. As explained therein, a CBT array is constructed using Legendre function shading of the transducer drive levels in order to maintain what has been described as frequency-invariant pattern control. Each transducer in the array is driven with a different signal level that follows the continuous Legendre shading function, with the drive levels gradually tapering from maximum at the center of the array to near-zero at the outer edges of the array (depending upon truncation of the arc formed by the curved speaker line array 100). The result is a speaker system that may provide wideband, extremely constant beamwidth and directivity behavior with virtually no side lobes.

A similar concept can be extended to a straight-line or flat-panel CBT arrays, with the use of appropriate signal delays. Such a technique is described, for example, in "Implementation of Straight-Line and Flat-Panel Constant Beamwidth Transducer (CBT) Loudspeaker Arrays Using Signal Delays," 113$^{th}$ Convention of the Audio Engineering Society, Preprint 5653, October 2002, and "Full-Sphere Sound Field of Constant Beamwidth Transducer (CBT) Loudspeaker Line Arrays," J. Audio Eng. Soc., vol. 51, no. 7/8, July/August 2003, both by D. B. Keele, Jr., and both of which are hereby incorporated by reference as if set forth fully herein.

Although CBT arrays have the potential for improved sound reproduction characteristics, they nonetheless still suffer from many of the same problems as conventional column array speakers. For example, the spacing between the driver units sets a limit to the upper frequency for directional control.

Another type of known speaker array comprises a two-dimensional array of forward-facing drive units. The two-dimensional array is composed of individual line arrays of drive units, with each line array offset or staggered from the neighboring line arrays. An example of such an array, which has been commercially marketed only recently (and therefore no admission concerning its potential status as prior art is intended by its inclusion in this background discussion of related art), is the YPS-1 "digital sound projector" available from Yamaha Electronics Corporation. The YPS-1 is described, for example, in a product brochure at http://www.yamaha.co.jp/english/product/av/pdfs/catalog/ysp1.pdf, as having 40 drive units of 4 cm size arranged in several rows, flanked at either end by a larger 11 cm drive unit. An on-board digital sound processor is apparently provided for controlling the drive units. The YPS-1 has various connectors including a coaxial video output to link it to a television, several digital inputs (optical and coaxial), and an RS-232C connector.

A two-dimensional array of forward-facing drive units, such as the YPS-1 or similar audio units, may potentially suffer from drawbacks such as lobing, and may also have limitations on the upper frequency response. Also, such a two-dimensional array may lack midrange warmth and body, and/or fail to convincingly reproduce certain audio sources, particularly music.

Accordingly, it would be advantageous to provide a speaker system which has a less adverse interaction between the loudspeaker and the listening room or area, and offers flexible directional control and/or steerability. It would further be advantageous to provide a speaker system that has more accurate sound timbre, and/or more accurate, believable and stable sound images over a wider listening area. It would also be advantageous to provide a speaker system that can be aesthetically packaged, and/or provides other benefits and advantages.

SUMMARY OF THE INVENTION

Certain embodiments disclosed herein are generally directed, in one aspect, to a sound reproduction system having a plurality of drive units arranged in a column or array, coupled with sound processing allowing improved steerability, directional control, width control, and/or beam overlay. In one embodiment, for example, a speaker column comprises two arrays of drive units arranged facing one another, separated by a relatively narrow gap. An elongate slot (comprising either a single slot or series of slots) along the length of the opposing arrays provides a path for sound output from the drive unit arrays. The individual drive units from each array may be symmetrically opposing one another, or else may be staggered with respect to the opposite array. Additional drive units, such as high frequency drivers or tweeters, may be added along the length of the elongate slot or elsewhere to increase the dynamic frequency range of the speaker system.

In another aspect, the drive units in each array may be physically arranged in a curved or arc-shaped pattern, such that the centermost drive unit protrudes beyond the other drive units, and the locations of other drive units progressively recede upwards and downwards along the edge of the arc. Alternatively, the drive units may be physically arranged in a line array. In other embodiments, the pattern is intermixed; for example, only some of the drive units may be arranged in a partial arc, while the remainder are arranged in a linear manner.

In another aspect, an input signal is processed so as to generate multiple drive unit signals, allowing adjustment or control of the directionality or other characteristics of the sound output from the drive units. For example, where the drive units are arranged in a line array, the input signal may be delayed in accordance with the drive unit's relative position with respect to the center axis of the speaker unit, thereby simulating the sound characteristics of a curved speaker array. Other processing techniques as described herein may allow adjusting the characteristics (e.g., widening or narrowing) the audio output (or beam) from a speaker line array, aiming the audio beam in specific direction, outputting multiple audio beams (which may be overlaid in whole or part), and/or creating virtual or simulated speakers using "real" phantom images by selectively or dynamically combining drive units into selected sub-arrays. A speaker line array may be combined with integrated signal processing and/or individual power amplifiers for each drive unit or for groups of drive units.

In another aspect, a speaker unit is configured with an amplifier output stage integrated or collocated with the speaker unit, while the first stage of the amplifier is located remotely. The first stage of the amplifier may be embodied in an audio control unit which also includes command and power distribution capability. Command and/or power signals may be communicated from an audio control unit to one or more speaker units, such as speaker line arrays, which may be located at different physical locations. The command and power signals may control the speaker unit so as to provide a directional or steerable sound image, with one or more audio beams, and/or to create one or more real phantom speaker images. The power signals may be generated from a tracking power supply, and may be generally low voltage in nature, on average, with occasional transient excursions above the normal supply rail level when needed to drive peak sound in the audio program. In one aspect, an intelligent digitally controllable speaker is provided according to certain embodiments as disclosed herein.

Further embodiments, variations and enhancements are also disclosed herein.

BRIEF DESCRIPTION OF THE DRAWINGS

FIGS. 19A through 19D are diagrams illustrating, from different viewpoints and cross-sections, a particular embodiment of a speaker line array having staggered drive units.

DETAILED DESCRIPTION OF PREFERRED EMBODIMENTS

Certain embodiments disclosed herein are generally directed, in one or more aspects, to a sound reproduction system having a plurality of drive units arranged in a column or array, coupled with sound processing allowing control over direction and width of the sound output, as well as the possibility of generating separate sound "beams" each controllable in terms of content, direction, and width. Various configurations of speaker line array are particularly advantageous for use in such a sound reproduction system. For example, a speaker column may comprise a single array of low frequency drive units, or alternatively may comprise two arrays of low frequency drive units arranged facing one another, separated by a relatively narrow gap. In the latter case, the individual drive units from each array may be symmetrically opposing one another, or else may be staggered with respect to the opposite array. An elongate slot (comprising either a single slot or series of slots) along the length of the opposing arrays provides a path for sound output from the drive unit arrays. Additional drive units, such as high frequency drivers or tweeters, may be added along the length of the elongate slot or elsewhere to increase the dynamic frequency range of the speaker system. The line array may be curved, partially curved, or straight; however, the sound processing may differ depending on the physical configuration of the drive units.

Embodiments as disclosed herein may be employed in a variety of applications, and may be particularly well suited for situations in which it is desired to provide a sound system providing a high degree of controllability over the direction and width of the sound output. One or more speaker line arrays may be advantageously employed in applications such as cinema, home theater, clubs, recording studios, amphitheaters, and various indoor or outdoor installations. Speaker line arrays may also be advantageously utilized in connection with flatscreen television monitors, desktop computer monitors, and so on, for providing improved audio controllability with computer or video games or the like.

Figure 1:
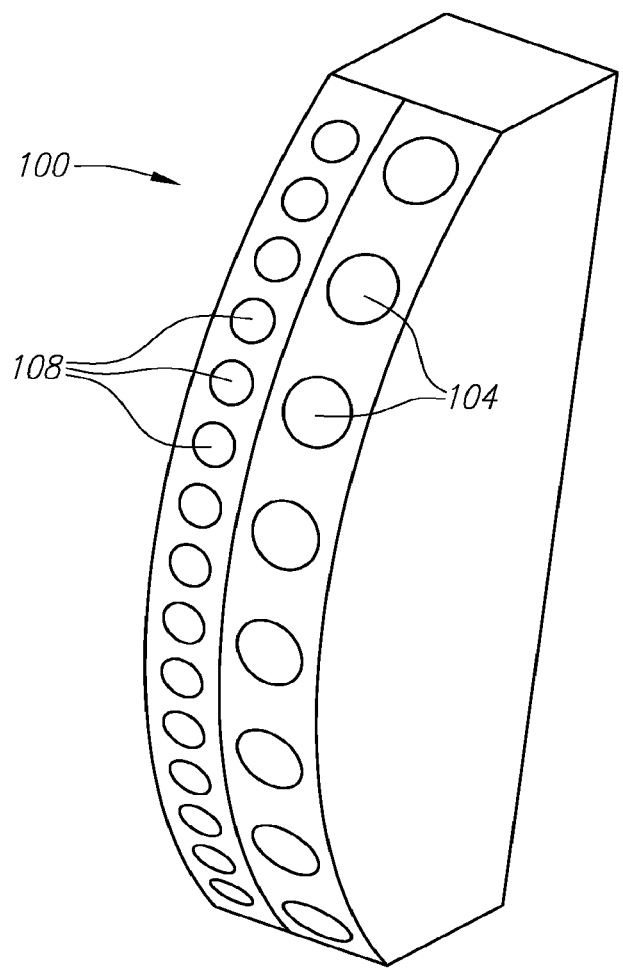
FIG. 1 is a diagram of a curved speaker line array as known in the art.
Figure 2A:
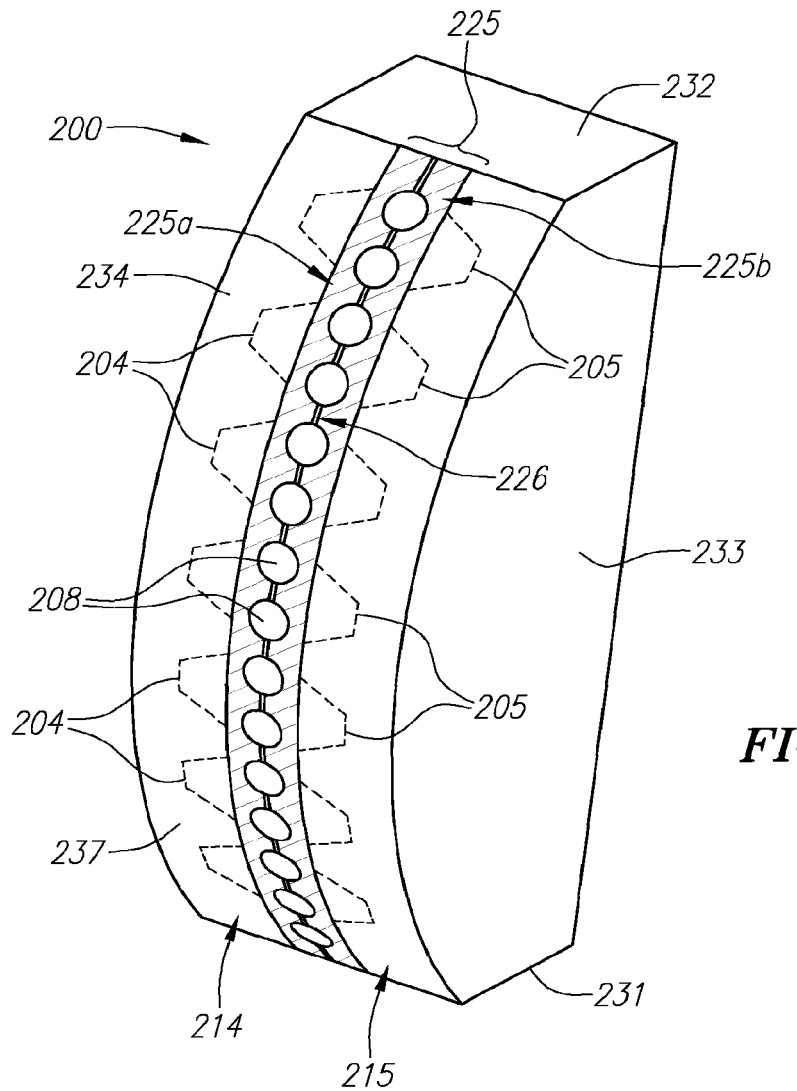
FIGS. 2A and 2B are diagrams of a curved speaker line array having a slot for sound output, in accordance with one embodiment as disclosed herein.
Figure 2B:
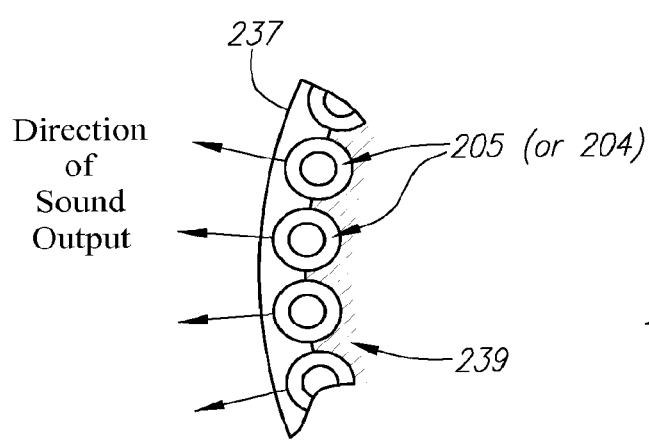

FIGS. 2A and 2B illustrate a curved speaker line array 200 having a slot for sound output, in accordance with one embodiment as disclosed herein. FIG. 2A is an oblique view diagram of a speaker unit 200, which, in one aspect, may be viewed as a type of speaker column. As illustrated therein, the speaker unit 200 may (but need not) have two side walls 233, 234 with a curved front faceplate 237 (which may comprise left and right sides) spanning therebetween. The curvature of the front faceplate 237 preferably follows an arc based on a continuous Legendre shading function, or a truncated portion thereof. The speaker unit 200 may additionally have a top wallplate 232 and a bottom wallplate 231, each interconnecting the side walls 233, 234 and the front faceplate 237.

The speaker unit 200 further comprises two curved speaker line arrays 214, 215 each comprising a series of drive units 204, 205 (shown with dotted lines). The drive units 204, 205 are preferably low and/or mid frequency range drive units, although in other embodiments they may have a different frequency range. The drive units 204, 205 of the two curved speaker lines arrays 214, 215 in this example are positioned facing one another, separated by a relatively narrow and elongate sound output slot 225. The elongate sound output slot 225, which may comprise either a single slot or series of slots, runs along the length of the two opposing speaker line arrays 214, 215 and provides a path for sound to be output from the drive units 204, 205. In this particular example, a frammel or dividing wall 226, preferably comprised of a material having a non-resonant characteristic, runs down the length of the main sound output slot 225, dividing it into two parallel sound output slots (left and right) 225a, 225b. The first sound output slot 225a provides a path for sound to be output from the first speaker line array 214, and the second sound output slot 225b provides a path for sound to be output from the second speaker line array 215. The drive units 204, 205 are preferably mounted on a baffle or other similar structure, in a manner acoustically isolating their forward sound radiation from their rearward sound radiation.

FIG. 2B illustrates a cutaway side view of the central right portion of the speaker unit 200 shown in FIG. 2A. In FIG. 2B, the drive units 205 are shown in solid lines, positioned in an arc along the curved front faceplate 237 of the speaker unit 200. In a preferred embodiment, acoustic absorbing material (such as, e.g., compressed foam) 239 is placed within the rear duct of the sound slot 225, circumjacent to the outer rear contours of the drive units 205. The acoustic absorbing material 239 is similarly disposed on the opposite side of the speaker unit 200, with respect to drive units 204. The acoustic absorbing material 239 provides a barrier on the rear side of the drive units 204, 205 and, along with the dividing wall 226, forces the sound output from the drive units 204, 205 to be generally compressed, turned (at a ninety degree or other sharp angle), and projected from the sound output slots 225a, 225b. In one aspect, the sound output slots 225a, 225b in effect transform the size, shape, and/or aspect ratio of the drive units 204, 205, having an impact on the stability and directionality of the apparent sound image.

The acoustic absorbing material 239 may help prevent, e.g., undesirable interference or reflections within the duct or chamber, that may otherwise be caused by soundwaves reflecting from the backwall or back corners of the duct, since the soundwaves have no means of egress except the slot 225. The acoustic absorbing material 239 may in certain embodiments also help to prevent the creation of standing waves, and/or minimize the variation of sound output response with respect to frequency so that the speaker output can be readily equalized by, e.g., any standard techniques, including analog or digital equalization. For example, cascaded filter sections may be employed to tailor the frequency response of the drive units 204, 205 in discrete frequency bands so as to provide a relatively uniform overall frequency response.

The acoustic absorbing material 239 in FIG. 2B, and other embodiments as will hereinafter be described, may comprise any suitable material, and is preferably non-resonant in nature, with sound absorbing qualities. The acoustic absorbing material 239 may, for example, comprise expanded or compressed foam, or else may comprise rubber, reinforced paper, fabric or fiber, damped polymer composites, or other materials or composites, including combinations of the foregoing materials.

Since an effect of the dividing wall 226, sound output slots 225a, 225b, and acoustic absorbing material 239 is to compress the sound waves output from the drive units 204, 205 and turn them towards the terminus of the sound output slots 225a, 225b, the drive units 204, 205 may have to work harder to overcome the resistance inherent in compressing the sound waves and having them redirected. At the same time the overall speaker unit 200 may have a narrower output profile and gain benefits in terms of directional control and characteristics. Further details of a slotted speaker construction are described, for example, in copending U.S. application Ser. No. 10/339,357 filed Jan. 8, 2003 and Ser. No. 10/937,76 filed Sep. 8, 2004, both of which are hereby incorporated by reference as if set forth fully herein.

In a preferred embodiment, the dimensions of the sound output slots 225a, 225b may be selected based upon various factors including, among other things, the expected frequency range of the audio output. Referring to FIG. 2B in particular, the sound ducts terminating in output slots 225a, 225b may be relatively truncated in nature; that is, the spacing from the outermost edge of the drive units 204, 205 to the curved front faceplate 237 may be kept relatively short, to avoid, e.g., the buildup of standing waves or turbulence, and also to minimize the work needed by the drive units 204, 205 to force the compressed sound waves towards the terminus of the sound output slots 225a, 225b. By preventing soundwaves from drive units 204, 205 to unfold significantly within the confines of the sound duct, the soundwaves emanating from the output slots 225a, 225b may have sound quality and dynamic range comparable to the soundwaves initially emitted from the drive units 204, 205 themselves. The width of the sound output slots 225a, 225b may be selected narrow enough to provide broad directional characteristics over the frequency range for which the wavelength of sound traveling in air is large compared with the slot dimensions. As an example, the width of the sound output slots 225a, 225b may be in the range of 8 to 12 millimeters. Narrowing the width of the sound output slots 225a, 225b may potentially decrease the efficiency of the drive units (which may be compensated by larger drive units and/or increased drive power), or may cause audible noise from turbulence. Therefore, the narrowness of the sound output slot 225a, 225b may be limited by, among other things, impedance losses that cannot be made up by increased drive power and the onset of sound artifacts or noise caused by turbulence or nonlinear airflow.

A potential benefit of a speaker unit arrangement in accordance with FIGS. 2A-2B, and other slotted speaker unit arrangements as described herein, is that sound emanating from the output slot 225 may generally tend to have a wide dispersion angle along the slot's long axis, as compared to the dispersion angle of a conventional forward-facing drive unit or line array. Thus, the speaker unit 200 may possess an extremely broad directional characteristic over the frequency range for which the wavelength of sound in air is large compared with the slot dimensions. Because of the wide dispersion angle along the long axis, the speaker unit 200 may provide a similar listening experience with respect to off-axis listeners at a variety of locations away from the center axis of the output slot 225. The advantageous dispersion characteristics may permit design choices that, for example, account for the relative likelihood that listeners will be positioned along one or the other axis of the soundwaves emanating from the output slot 225. These design choices, generally not available for equiaxed drivers, are particularly advantageous in confined listening spaces.

In one aspect, the sound ducts of speaker unit 200 associated with each of the drive units 204, 205 and terminating in output slots 225*a*, 225*b* effectively "turn" the soundwaves output from the drive units 204, 205 (by 90° in this example), so that the sound is carried to the output slot 225 and released while retaining a sufficient degree of sound quality, and modifying the effective shape of the speaker output from an elliptical or circular radiator (as the case may be for drive units 204, 205) to an elongated rectangular radiator. In addition, the total radiating surface area can be advantageously reduced, as compared to the radiating surface area of the drive units themselves, minimizing the space needed. The aspect ratio of the sound output slots 225*a*, 225*b* can be adjusted or tailored to modify the directional characteristic of the acoustic output in order to, for example, improve sound quality at off-axis listening positions.

In the example illustrated, the individual drive units 204, 205 are arranged symmetrically so that they directly oppose one another, although, as explained later herein, in other related embodiments they may be staggered with respect to the drive units in the opposite line array. Among other advantages or benefits, in addition to differences in stability or directionality of the sound image, the arrangement of FIGS. 2A-2B whereby the drive units 204, 205 are at a right angle to the direction of sound output allows a narrower front sound output profile as compared to, e.g., a standard speaker column, or a pair of speaker columns.

The drive units 204, 205, as noted, are preferably of a nature suitable for reproducing low and/or mid range frequencies. A plurality of additional smaller drive units 208 (e.g., high frequency drive units) may optionally be provided, preferably arranged in a linear array along the central axis between the two line arrays 214, 215 of low/mid frequency drive units (i.e., along the dividing wall 226), or elsewhere, to increase the dynamic frequency range of the speaker system. Advantageously, the sound radiated from the high frequency drive units 208 emanates from approximately the same location as the low/mid frequency drive units 204, 205, so that the sound reproduction is seamless across the frequency spectrum. If necessary, slight delays can be added to the audio signal(s) feeding the high frequency drive units 208 in order to synchronize their acoustic output with the low/mid frequency drive units 204, 205.

Figure 4A:
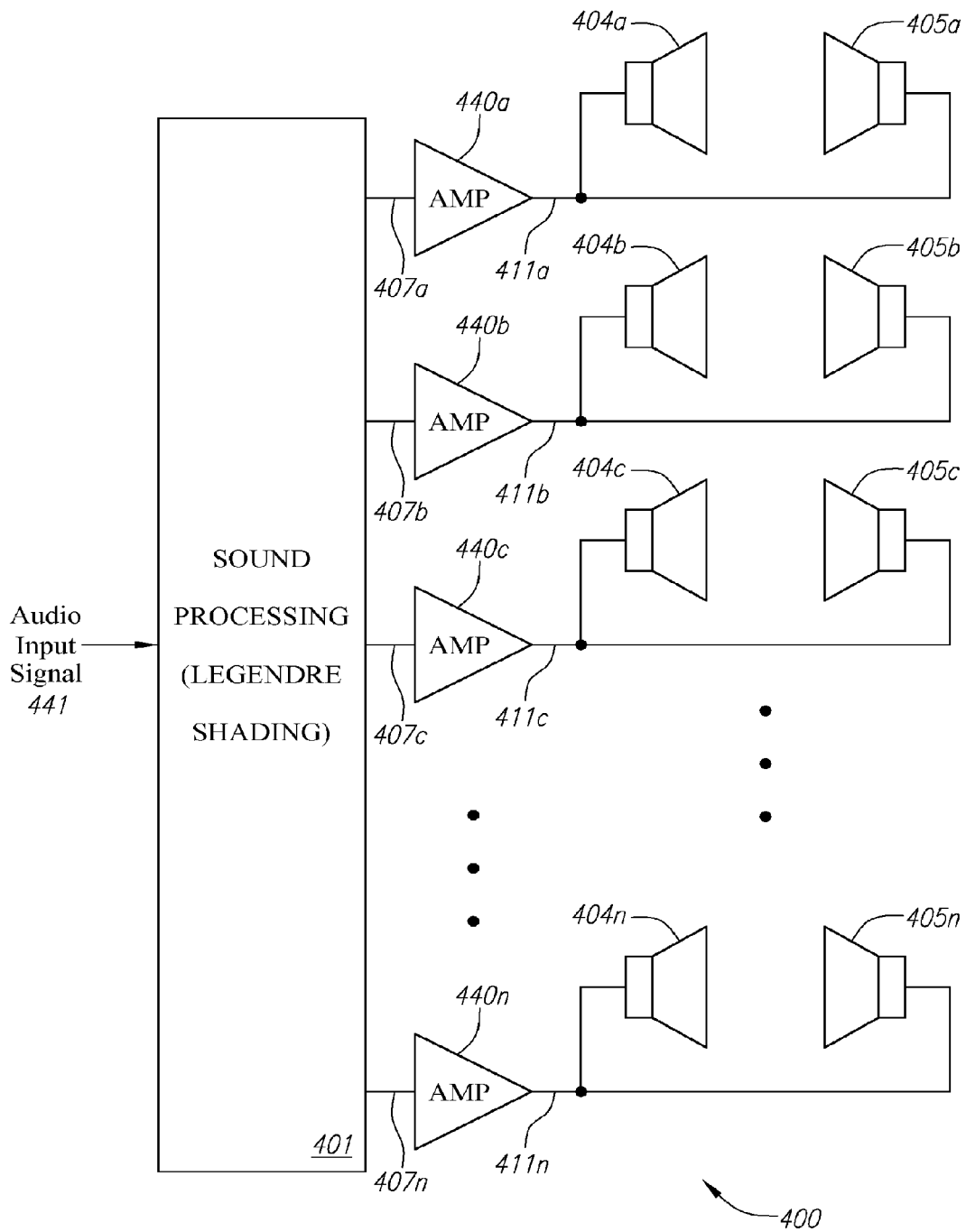
FIGS. 4A and 4B are high-level block diagrams of circuits for providing input signals to a speaker line array.

According to one embodiment, an audio input signal for the speaker unit 200 of FIGS. 2A-2B is processed in a manner providing, e.g., frequency-independent Legendre shading, directional control, or other effects. FIG. 4A is a high-level block diagram of circuitry for providing audio input signals to a speaker unit such as illustrated in FIGS. 2A-2B. As shown in FIG. 4A, the sound reproduction circuitry 400 includes a sound processor 401 receiving an audio input signal 441, and providing a set of processed audio signals 407*a* . . . *n* to an array of amplifiers 440*a* . . . *n*. Each of the amplifiers 440*a* . . . *n* is coupled to a pair of drive units, such that the first amplifier output signal 411*a* is coupled to a first pair of drive units 404*a*, 405*a*, a second amplifier output signal 411*b* is coupled to a second pair of drive units 404*b*, 405*b*, and so on, up until the Nth amplifier output signal 411*n* being coupled to the last pair of drive units 404*n*, 405*n*. It is assumed in FIG. 4A that the drive units 404*a* . . . *n*, 405*a* . . . *n* correspond to their general physical position in a speaker line array such as illustrated in FIG. 2A, and thus the drive units 404*a*, 405*a* would be at the "top" of the speaker line array, while drive units 404*n*, 405*n* would be at the "bottom" of the speaker line array. Likewise, drive units 404*a* . . . *n* would be on the "left" of the speaker line array (corresponding to drive units 204 in FIG. 2A), while drive units 405*a* . . . *n* would be on the "right" of the speaker line array (corresponding to drive units 205 in FIG. 2A).

Because drive units 204, 205 directly face each other, with each pair of opposing drive units being disposed at the same radial angle, each pair of drive units can share the same input signal—thus, for example, the first amplifier output signal 411*a* feeds both left drive unit 404*a* and right drive unit 405*a*.

In operation, where the speaker line array is shaped in an arc pattern such as depicted in FIG. 2A, the sound processor 401 may be configured to drive each of the amplifiers 440*a* . . . *n* with a different signal level that follows the continuous Legendre shading function, with the drive levels gradually tapering from maximum at the center of the speaker line array to near zero at the outer edges of the array (i.e., drive units 404*a*, 405*a* and 404*n*, 405*n*). An example of such processing is described in "Practical Implementation of Constant Beamwidth Transducer (CBT) Loudspeaker Circular-Arc Line Arrays," previously incorporated by reference as if set forth fully herein. The processed drive levels output from the sound processor 401 depend in part on the number of drive units 404*a* . . . *n*, 405*a* . . . *n* in the speaker system, their relative size and spacing, the amount of truncation of the Legendre shading function, and the number of discrete "steps," if any, used to approximate a continuous Legendre shading function.

Figure 21:
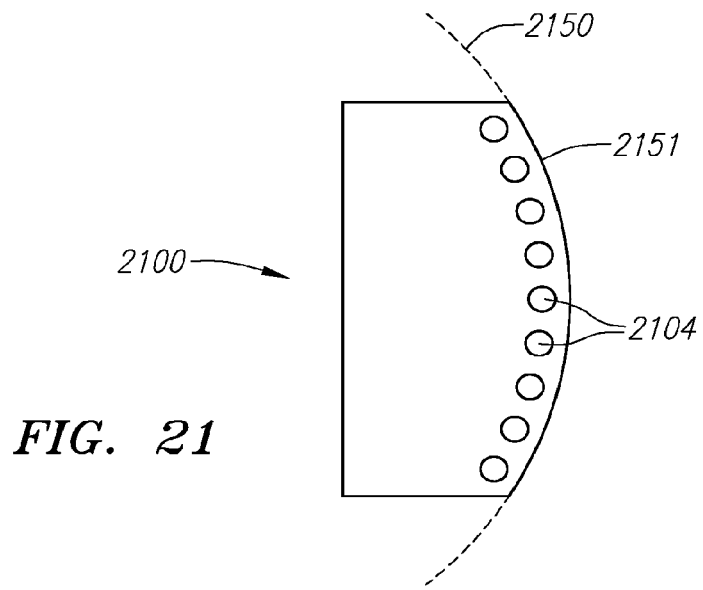
FIG. 21 is a sideview diagram illustrating an example of speaker unit profile formed by truncating the curved arc corresponding to a Legendre function.

An example is illustrated in FIG. 21. There, the continuous Legendre shading function is illustrated in dotted lines along arc 2150, with the solid line 2151 representing the curvature of the front faceplate 237 in FIG. 2A, truncated at −12 dB. The relative positioning of the drive units 2104 are also depicted (the drive units 2104 may be paired on opposite sides, or may be staggered, in accordance with various examples disclosed elsewhere herein). In general, the more drive units 2104 that are present, the better the approximation of a continuous Legendre shading function can be achieved. Also, in general, the larger the drive units 2104, the more difficult it will be to approximate the Legendre shading function because the fewer drive units can be utilized in the limited space of the front arc 2151. Thus, a tradeoff generally may need to be made between the size and number of drive units 2104 in the line array, with corresponding effect on controllability and frequency range.

The sound processing unit 401 may each comprise, for example, a digital signal processor (not shown) and supporting electronics. In addition to providing Legendre shading, the sound processing units 402 may provide any necessary equalization, and may also provide signal routing and beam control functions, examples of which are described in more detail hereinafter. It is also possible to obtain the shading by passive means, thereby reducing the number of amplifiers that might otherwise be required. For example, each drive unit's sensitivity may be individually designed to match that required for a particular position in the array (aided in part by either series or parallel connection of the drive units in an opposing pair configuration). Alternatively, or in addition, a passive attenuating network may be placed between the amplifier and drive unit, or otherwise in series therewith. Similarly, a passive delay network may also be used between an amplifier and drive unit, or otherwise in series therewith, tailored to the delay required for a particular location in the speaker line array for simulating a curved line array.

A speaker line array configured in accordance with FIGS. 2A and 2B may provide various benefits and advantages over conventional CBT line arrays. For example, the speaker unit 200 may allow drive units 204, 205 to be placed closer together than conventional CBT line arrays would allow, because the distance between the effective sound radiating areas is defined by distance between the sound output slots, not the center-to-center distance between the actual drive units as with conventional CBT line arrays. The sound output slots can be placed closer together than the actual drive units of a conventional CBT line array. The closer spacing of the effective sound radiating areas may improve the upper frequency response and directional control.

Another separate benefit or advantage of closer effective spacing of the sound radiating areas is that the speaker unit 200 may have a narrow profile in terms of its relative sound radiating area (e.g., the area along slot 225), in comparison to, for example, a conventional CBT line array, or other speaker line arrays.

In an example of a speaker unit 200 as may be constructed in accordance with one embodiment, a total of 16 low/mid-frequency drive units may be provided (eight drive units 204 in one array and eight drive units 205 in the other array), the drive units 204, 205 may be selected to be 70 mm in diameter, the center-to-center spacing between drive units 204 or 205 in each array may be selected to be 90 mm apart, and the high frequency drive units 208 may, for example, be approximately twice as numerous as the number of drive units 204 or 205 in either the left or right line array, and may be spaced 45 mm center-to-center. In this example, the sound output slots 225a, 225b may be in the range of, e.g., 10-12 mm in width. These particulars are provided in the context of a specific example, and are not meant to be limited in any manner.

A speaker unit configured in accordance with various embodiments as disclosed above and elsewhere herein may provide, among other benefits and advantages, wideband response along with highly constant beamwidth and directivity behavior; further, such a speaker unit may provide such benefits or advantages with an absence of significant side lobes.

Figures 3A, 3B:
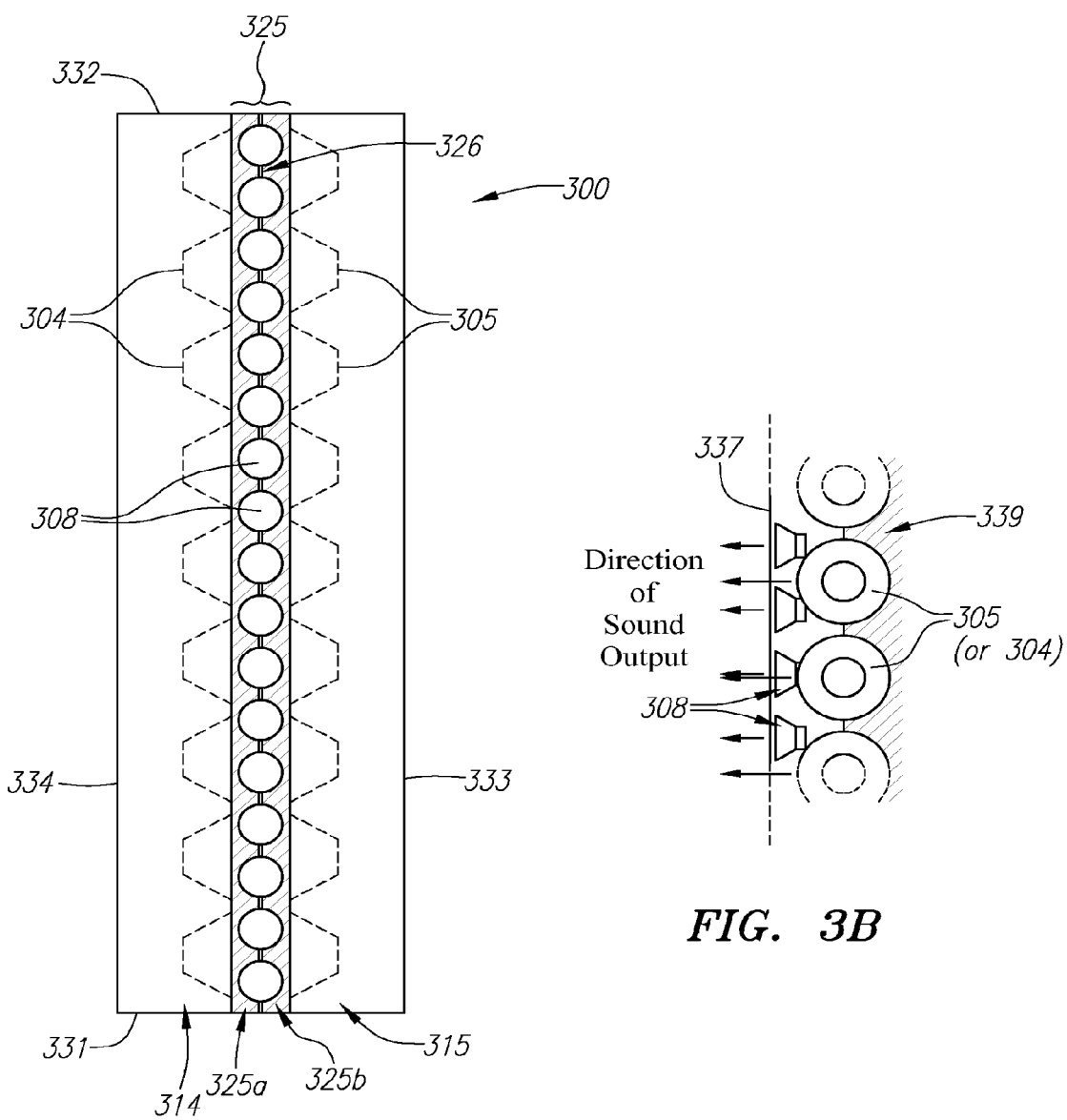
FIGS. 3A and 3B are diagrams showing another embodiment of a speaker line array.

FIGS. 3A-3B illustrate another embodiment of a speaker unit 300 utilizing a form of speaker line array. The speaker unit 300 illustrated in FIGS. 3A-3B is similar to the speaker unit 200 in many respects, and reference numerals 3xx in FIGS. 3A-3B generally correspond to analogous features designated with reference numerals 2xx in FIGS. 2A-2B. As with speaker unit 200 in FIGS. 2A-2B, the speaker unit 300 shown in FIG. 3A has a pair of opposing speaker line arrays 314, 315 each comprising a series of drive units 304, 305 (shown with dotted lines). The drive units 304, 305 are, as before, preferably low and/or mid frequency range drive units, although in other embodiments they may have a different frequency range. The drive units 304, 305 of the two curved speaker lines arrays 314, 315 in this example are positioned facing one another, separated by a relatively narrow and elongate sound output slot 325. The elongate sound output slot 325, which may comprise either a single slot or series of slots, runs along the length of the two opposing speaker line arrays 314, 315 and provides a path for sound to be output from the low/mid frequency drive units 304, 305, much as described in connection with FIGS. 2A-2B. In this particular example, a dividing wall 326 runs down the length of the main sound output slot 325, dividing it into two parallel sound output slots (left and right) 325a, 325b. The first sound output slot 325a provides a path for sound to be output from the first speaker line array 314, and the second sound output slot 325b provides a path for sound to be output from the second speaker line array 314. The drive units 304, 305 are preferably mounted on a baffle or other similar structure, in a manner acoustically isolating their forward sound radiation from their rearward sound radiation.

The speaker unit 300 may (but need not) have two side walls 333, 334 with a front faceplate 337 (which may comprise left and right sides) spanning therebetween. The speaker unit 300 may additionally have a top wallplate 332 and a bottom wallplate 331, interconnecting the side walls 333, 334 and the front faceplate 337. The speaker unit 300 may also have a series of high frequency drive units 308 along the sound output slot 325. Advantageously, the sound radiated from the high frequency drive units 308 emanates from approximately the same location as the low/mid frequency drive units 304, 305, so that the sound reproduction is seamless across the frequency spectrum. If necessary, slight delays can be added to the audio signal(s) feeding the high frequency drive units 308 in order to synchronize their acoustic output with the low/mid frequency drive units 304, 305.

Unlike speaker unit 200, which has a front faceplate 337 preferably following an arc based on a continuous Legendre shading function, or a truncated portion thereof, the front faceplate 337 of the speaker unit 300 in FIGS. 3A-3B is preferably substantially flat. The curvature of the front faceplate 227 of the embodiment shown in FIGS. 2A-2B may instead be simulated by electronic delays dependent upon the relative location of the drive units 304, 305. The drive units 304, 305 located in the center portion of the speaker unit 300 would have the least added delay (because they correspond to the location that would be closest to the listener according to the Legendre shading function) or no delay, while the drive units 304, 305 located at the topmost and bottommost portions of the speaker unit 300 would have the most added delay (because they correspond to locations that would be furthest from the listener according to the Legendre shading function).

Figure 4B:
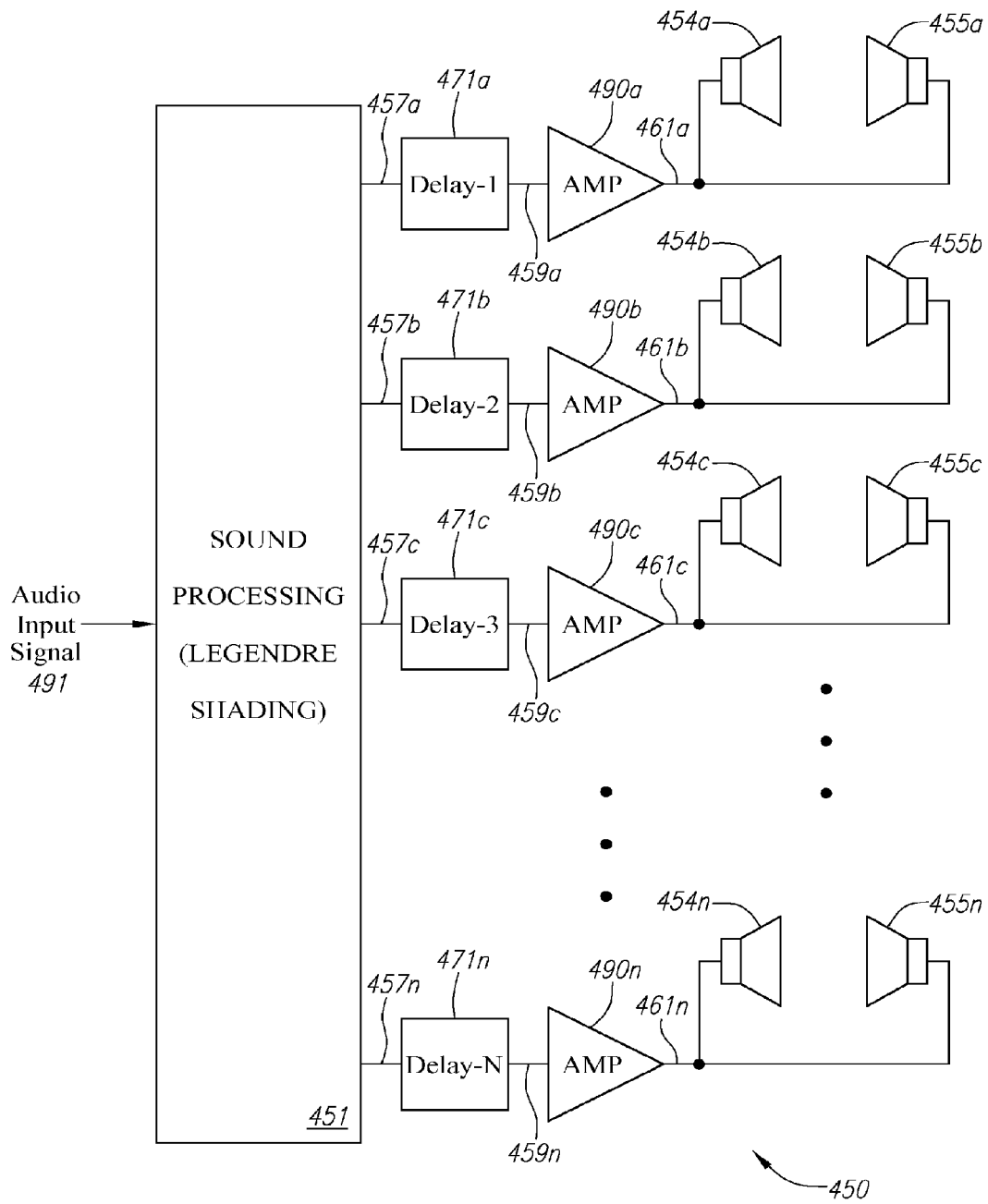

FIG. 4B is a high-level block diagram of one embodiment of a circuit or system as may be used for providing input signals to the speaker unit 300 illustrated in FIGS. 3A-3B. The sound reproduction circuitry 450 illustrated in FIG. 4B is similar to the circuitry 400 shown in FIG. 4A, but adds delay to various audio output signals to simulate the curvature along the Legendre shading function. Similar to the system 400 of FIG. 4A, the sound reproduction circuitry 450 of FIG. 4B may include a sound processor 451 receiving an audio input signal 491, and providing a set of processed audio signals 457a . . . n to an array of amplifiers 490a . . . n. Each of the amplifiers 490a . . . n in this example is coupled to a pair of drive units, such that the first amplifier output signal 461a is coupled to a first pair of drive units 454a, 455a, a second amplifier output signal 461b is coupled to a second pair of drive units 454b, 455b, and so on, up until the Nth amplifier output signal 461n being coupled to the last pair of drive units 454n, 455n. It is assumed in FIG. 4B that the drive units 454a . . . n, 455a . . . n correspond to their general physical position in a speaker line array such as illustrated in FIG. 3A, and thus the drive units 454a, 455a would be at the "top" of the speaker line array, while drive units 454n, 455n would be at the "bottom" of the speaker line array. Likewise, drive units 454a . . . n would be on the "left" of the speaker line array (corresponding to drive units 304 in FIG. 3A), while drive units 455a . . . n would be on the "right" of the speaker line array (corresponding to drive units 305 in FIG. 3A).

Figure 22:
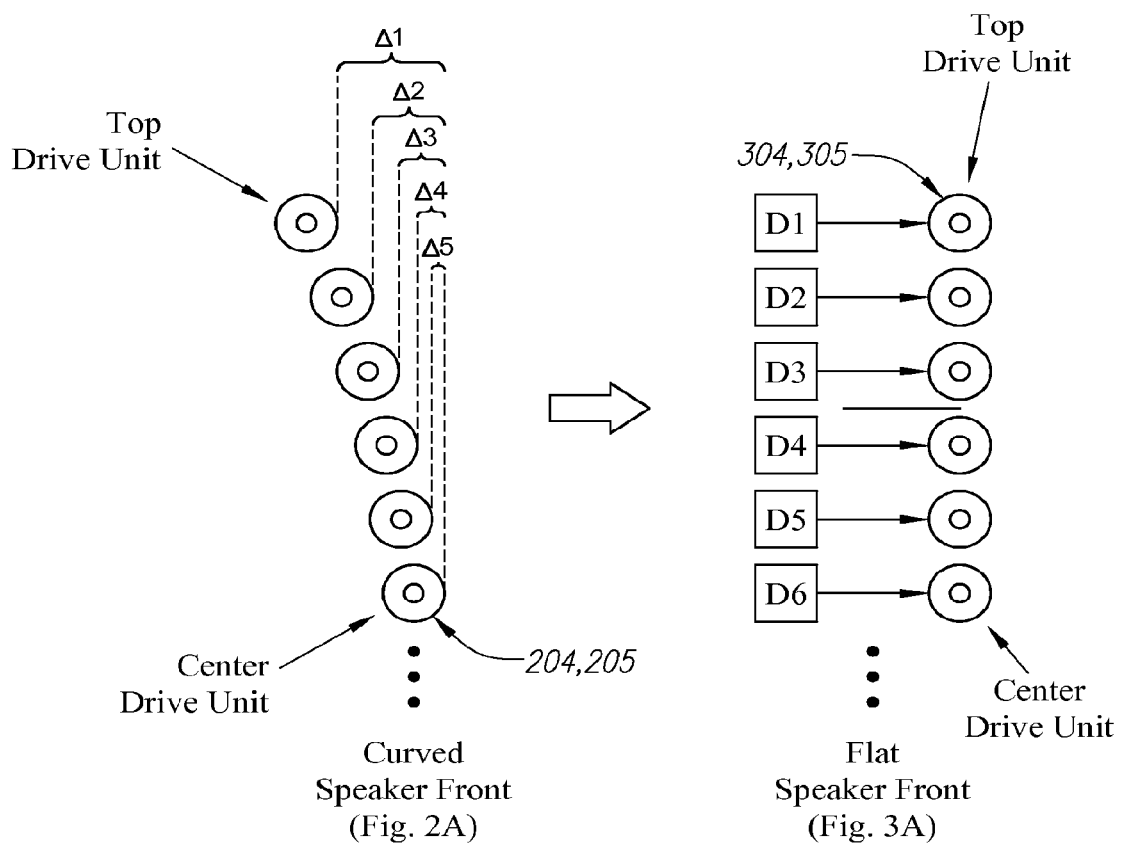
FIG. 22 is a diagram illustrating how delay values may be calculated for drive units of a flatfaced speaker unit to simulate the profile of a speaker unit curved according to a Legendre shading function.

Because drive units 304, 305 directly face each other in the particular example of FIG. 3A, with each pair of opposing drive units 304, 305 being disposed at the same relative distance from the central axis of the speaker unit 300, each pair of opposing drive units can share the same input signal—thus, for example, the first amplifier output signal 461a feeds both left drive unit 454a and right drive unit 455a, and so forth for the other amplifier output signals 461b . . . n and drive units 454b . . . n, 455b . . . n. Each amplifier output signal 461a . . . n also has an associated delay 471a . . . n corresponding to the added distance that the soundwaves would need to travel in air if the particular drive unit 304, 305 were physically positioned along the arc of the Legendre shading function, as in FIG. 2A. The amount of delay required for each drive unit 304, 305 is conceptually illustrated in FIG. 22. FIG. 22 shows an curved speaker front on the left side thereof, having an arc based upon the Legendre shading function as with the speaker unit 200 of FIG. 2A. The relative distance of each drive unit 204, 205 is also illustrated, with Δ1 being the differential distance from the front of the center (and hence frontmost) drive unit to the front of the topmost (and hence furthest back) drive unit, and hence the longest distance; Δ2 being the differential distance from the front of the center drive unit to the front of the second drive unit from the top (and hence the drive unit next further back), and hence the second longest distance; and so forth. The distances Δ1, Δ2, Δ3, etc. can be readily transformed to delay quantities D1, D2, D3, etc. by calculating the length of time that it would take soundwaves to travel those distances in air, and will generally be in the order of milliseconds or fractions thereof. The delay quantities D1, D2, D3, . . . are the same delay quantities DELAY-1, DELAY-2, DELAY-3, . . . applied by the circuitry in FIG. 4B, in order to simulate the front curvature of the speaker unit 200 in FIG. 2A with the flat-faced speaker unit 300 of FIG. 3A.

In operation, as with FIG. 2A, the sound processor 451 may be configured to drive each of the amplifiers 490a . . . n with a different signal level that follows the continuous Legendre shading function, with the drive levels gradually tapering from maximum at the center of the speaker line array to near zero at the outer edges of the array (i.e., drive units 454a, 455a and 454n, 455n). As previously noted, the processed drive levels output from the sound processor 451 depend in part on the number of drive units 454a . . . n, 455a . . . n in the speaker system, their relative size and spacing, the amount of truncation of the Legendre shading function, and the number of discrete "steps," if any, used to approximate a continuous Legendre shading function. In addition, the delay quantities introduced by delays 471a . . . n are cumulative to the processing carried out by the sound processor 451.

While delays 471a . . . n are shown conceptually as separate blocks in FIG. 4B, it should be understood that the delays 471a . . . n may be implemented in any of a variety of manners—for example, using hardware delays (which may be tunable), or by using programming the delays using digital signal processing that may be incorporated in the sound processor 451. The delay circuit may thus take the form of any suitable electronic circuitry (either active or passive, and either analog or digital), and preferably have minimal or no impact on the content of the audio output signal, at least over the frequencies being reproduced.

Figure 5:
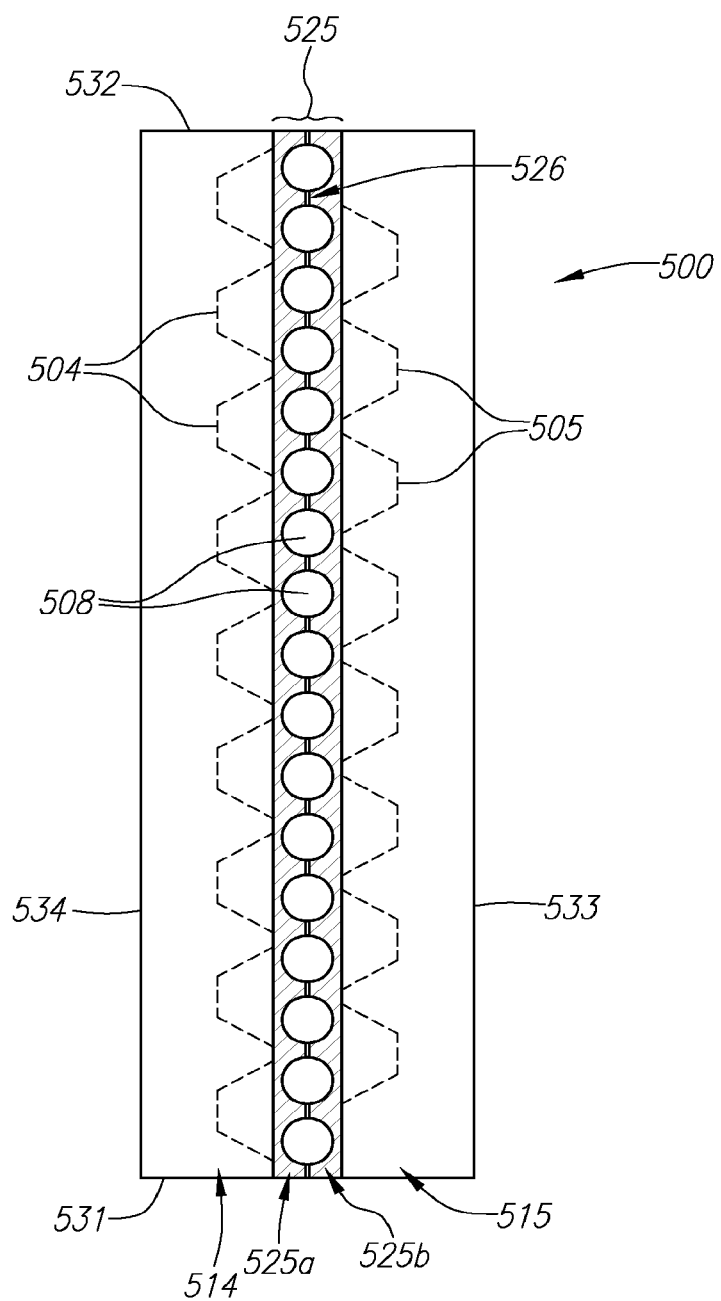
FIG. 5 is a diagram of another embodiment of a speaker line array, having staggered drive units.

FIG. 5 illustrates another embodiment of a speaker unit 500 configured as a speaker line array. The speaker unit 500 illustrated in FIG. 5 is similar to the speaker unit 300 shown in FIGS. 3A-3B in many respects; thus, reference numerals 5xx in FIG. 5 generally correspond to analogous features designated with reference numerals 3xx used in FIGS. 3A-3B. As with speaker unit 300 in FIGS. 3A-3B, the speaker unit 500 shown in FIG. 5 has a pair of opposing speaker line arrays 514, 515, each comprising a series of drive units 504, 505 (shown with dotted lines). The main difference over the speaker unit 300 of FIGS. 3A-3B is that the drive units 504 of speaker unit 500 in FIG. 5 are staggered with respect to the opposing drive units 505. A particular advantage of the speaker unit 500 of FIG. 5 is that a more graduated Legendre shading effect can be achieved, because the intervals between the drive units 504, 505 are effectively cut in half, and so reduces spatial aliasing. Spatial aliasing is a known phenomenon described in more detail, for example, in R. Schmidmaier and D. G. Meyer, "Dynamic Amplitude Shading of Electronically Steered Line Source Arrays," $92^{nd}$ Convention of the Audio Engineering Society, Preprint 3272 (Mar. 24-27, 1992), hereby incorporated by reference as if set forth fully herein. As generally explained therein, for a given spacing d of acoustical sources, no spatial aliasing occurs (and therefore no grating lobes are produced) for frequencies f below f=c/2d, where c is the velocity of sound. Therefore, reducing the spacing between drive units by means of staggering their relative positions in opposing slots may advantageously increase the first frequency at which spatial aliasing occurs along the axis of the array. Similarly, the ability to space the drive units close together by placing them face-to-face, for example, may advantageously reduce the effect of lobes perpendicular to the slot axis. The speaker unit 500 of FIG. 5 may require some additional processing because the output signals to opposing drive units can no longer be shared.

In other respects, the speaker unit 500 is very similar to that of FIGS. 3A-3B. The drive units 504, 505 are, as before, preferably embodied as low and/or mid frequency range drive units, although they may also cover a different frequency range. The drive units 504, 505 are, as noted above, positioned facing one another but staggered, and are separated by a relatively narrow and elongate sound output slot 525. The elongate sound output slot 525 may comprise either a single slot or series of slots, and runs along the length of the two opposing speaker line arrays 514, 515, providing a path for sound to be output from the low/mid frequency drive units 504, 505 as described previously with respect to the other similar speaker units. In this particular example, a dividing wall 526 runs down the length of the main sound output slot 525, dividing it into two parallel sound output slots (left and right) 525a, 525b. As with the previously described speaker units, the first sound output slot 525a provides a path for sound to be output from the first speaker line array 514, and the second sound output slot 525b provides a path for sound to be output from the second speaker line array 515. The drive units 504, 505 are preferably mounted on a baffle or other similar structure, in a manner acoustically isolating their forward sound radiation from their rearward sound radiation. The speaker unit 500 may also have high frequency drive units 508 running down the length of the main output slot 525. Advantageously, the sound radiated from the high frequency drive units 508 emanates from approximately the same location as the low/mid frequency drive units 504, 505, so that the sound reproduction is seamless across the frequency spectrum. If necessary, slight delays can be added to the audio signal(s) feeding the high frequency drive units 508 in order to synchronize their acoustic output with the low/mid frequency drive units 504, 505.

The speaker unit 500 may (but need not) have two side walls 533, 534 with a front faceplate 537 (which may comprise left and right sides) spanning therebetween. The speaker unit 500 may additionally have a top wallplate 532 and a bottom wallplate 531, interconnecting the side walls 533, 534 and the front faceplate 537. The speaker unit 500 also preferably has acoustic absorbing material, similar to as shown in FIG. 3B, around the rear contours of the drive units 504, 505 to force the soundwaves out of the output slot 525, and to reduce, e.g., turbulence and/or standing waves that may otherwise arise.

Figures 13A, 13B:
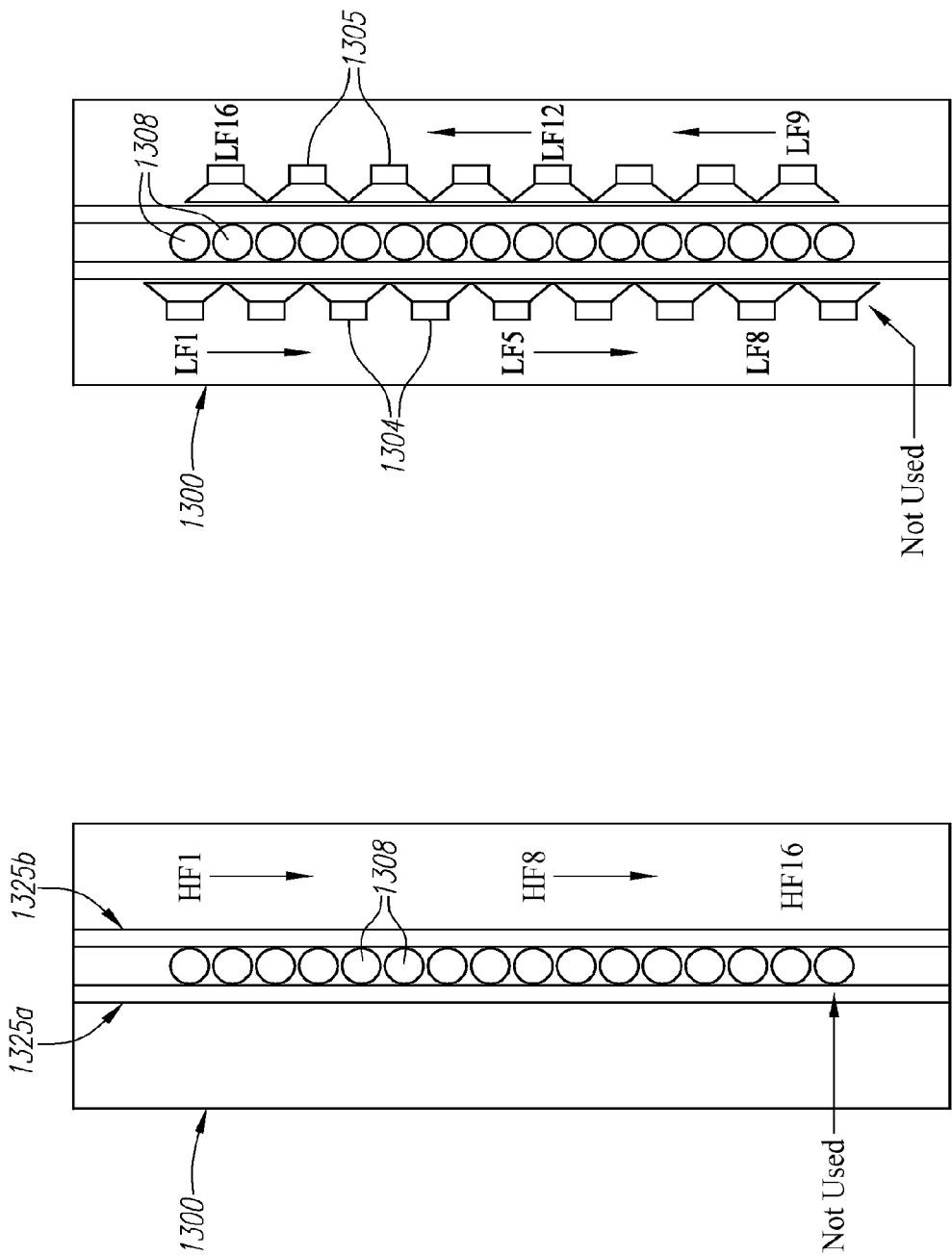
FIGS. 13A and 13B are different cross-sectional views of a speaker line array as may be used, for example, in connection with the sound system of FIG. 10, FIGS. 11A-11B, or other sound systems.

A particular speaker unit embodiment constructed in accordance with the general principles of FIG. 5 is illustrated in FIGS. 13A (front view) and 13B (cross sectional front view). As depicted therein, a speaker unit 1300 includes two speaker line arrays facing one another and each having eight low or mid frequency drive units 1304, 1305 in use (shown in solid in FIG. 13B), staggered with respect to the drive units on the opposing line array. An array of sixteen high frequency drive units 1308 (shown in solid in FIG. 13A) are positioned down the middle of the speaker unit 1300. The low/mid frequency drive units 1304, 1305 radiate acoustically from sound output slots 1325*a*, 1325*b*, as described above.

Figure 6:
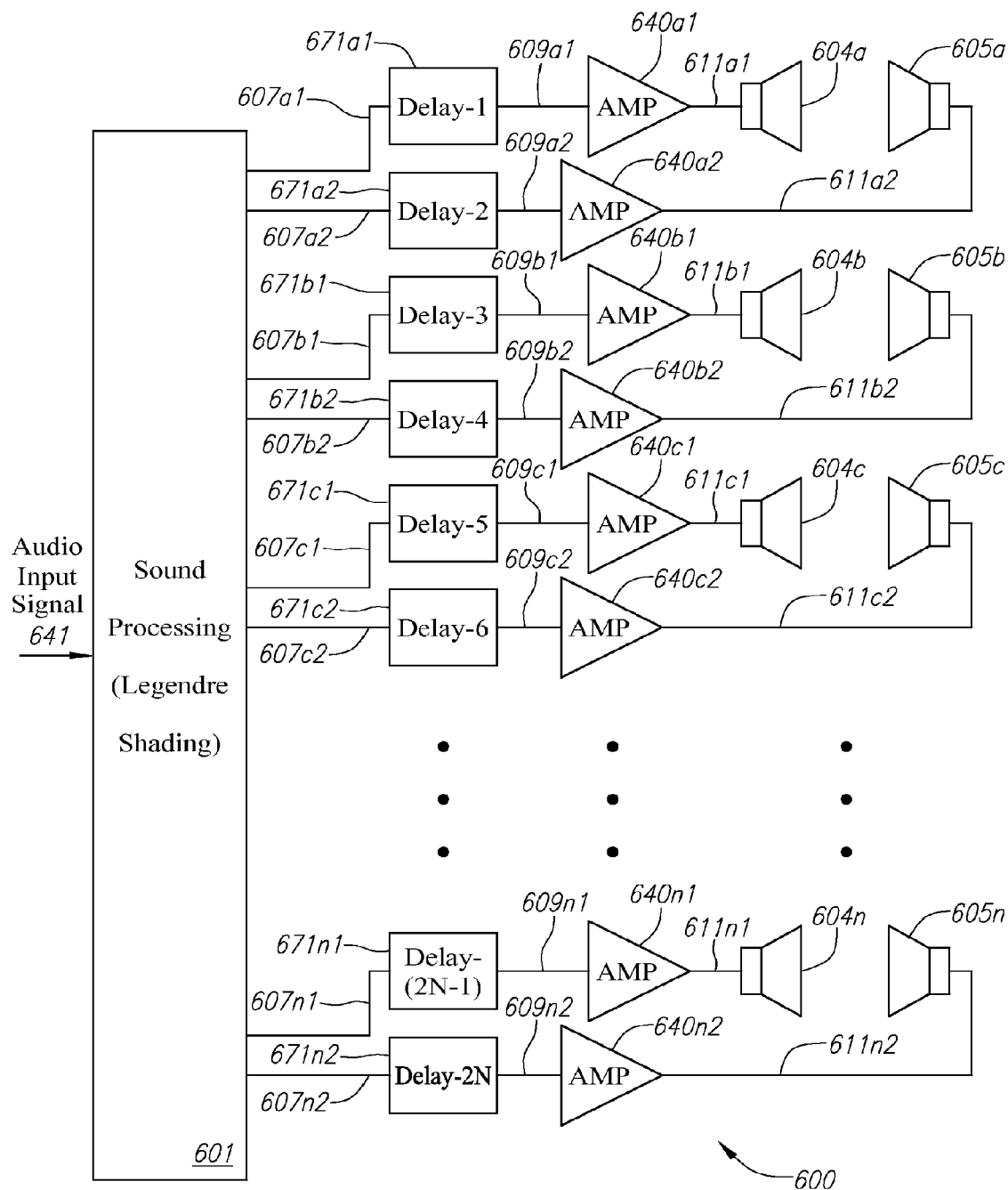
FIG. 6 is a high-level block diagram of a circuit for providing input signals to a speaker line array such as illustrated, for example, in FIG. 5.

Sound processing for speaker unit 500 (or 1300) is similar to that carried out for speaker unit 300 of FIGS. 3A-3B, but because the drive units 504, 505 are staggered additional components may be needed. FIG. 6 is a high-level block diagram depicting an embodiment of circuitry as may be used for providing input signals to the speaker unit 500 illustrated in FIG. 5. The sound reproduction circuitry 600 illustrated in FIG. 6 is similar to the circuitry 450 shown in FIG. 4B, but includes a separate output signal and delay for each drive unit 504, 505 (depicted as 604*a* . . . *n*, 605*a* . . . *n* in FIG. 6). As before the delays 671 have the effect of simulating the curvature along the Legendre shading function. Similar to the circuitry 450 of FIG. 4B, the sound reproduction circuitry 600 of FIG. 6 may include a sound processor 601 receiving an audio input signal 641, and providing a set of processed audio signals 607*a*1,2 . . . *n*1,2 to an array of amplifiers 640*a*1,2 . . . *n*1,2. Each of the amplifiers 640*a*1,2 . . . *n*1,2 in this example is coupled to a single drive unit, such that the first amplifier output signal 611*a*1 is coupled to a first left drive unit 604*a*, a second amplifier output signal 611*a*2 is coupled to a first right drive units 605*a*, a third amplifier output signal 611*b*1 is coupled to a second left drive unit 604*b*, a fourth amplifier output signal 611*b*2 is coupled to a second right drive unit 605*b*, and so on, up until the Nth pair of amplifier output signals 611*n*1,2 being coupled to the last pair of drive units 604*n*, 605*n*.

It is assumed in FIG. 6 that the drive units 604*a* . . . *n*, 605*a* . . . *n* correspond to their general physical position in a speaker line array such as illustrated in FIG. 5, and thus the drive units 604*a*, 605*a* would be at the "top" of the speaker line array, while drive units 604*n*,6055*n* would be at the "bottom" of the speaker line array. Likewise, drive units 604*a* . . . *n* would be on the "left" of the speaker line array (corresponding to drive units 504 in FIG. 5), while drive units 605*a* . . . *n* would be on the "right" of the speaker line array (corresponding to drive units 505 in FIG. 5).

Similar to the speaker unit 300 and associated processing in FIG. 4B, each amplifier output signal 611*a*1,2 . . . *n*1,2 also has an associated delay 671*a*1,2 . . . *n*1,2 corresponding to the added distance that the soundwaves would need to travel in air if the particular drive unit 504, 505 were physically positioned along the arc of the Legendre shading function, as in FIG. 2A. The amount of delay required for each drive unit 504, 505 is calculated as before, described with respect to FIG. 22.

Although the speaker unit 500 and associated processing has been described in relation to a flat-front speaker unit (similar to speaker unit 300 of FIGS. 3A-3B), the same technique of staggering drive units 504, 505 may also be applied in other embodiments, such as the curved-face speaker unit 200 of FIGS. 2A-2B.

Figure 23:
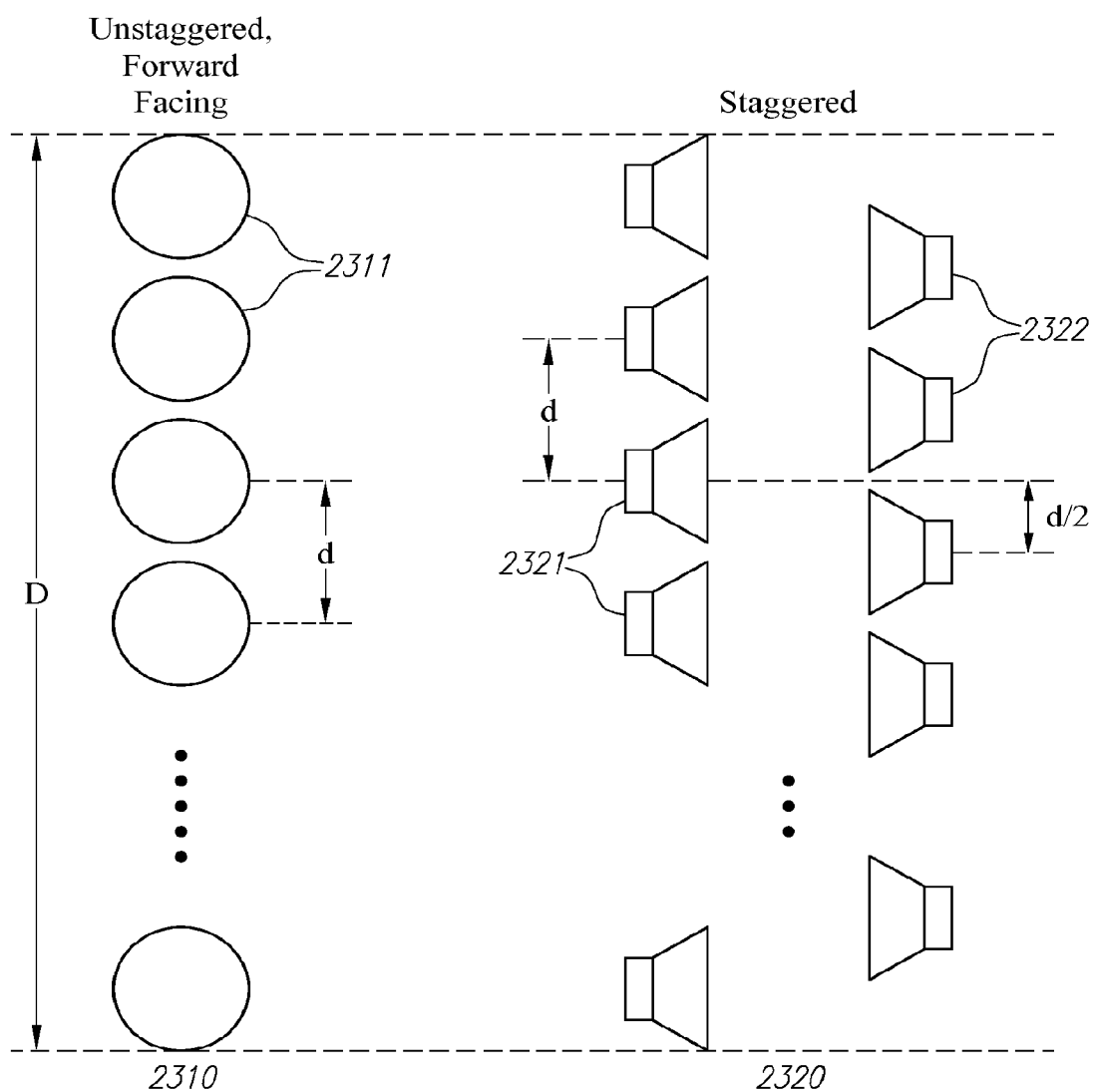
FIG. 23 is a diagram comparing certain characteristics of a conventional line array speaker unit having non-staggered drive units with a slotted dual line array speaker unit having staggered drive units.

A speaker line array configured in accordance with FIG. 5 may provide various benefits and advantages over conventional CBT line arrays and other speaker line arrays. For example, the speaker unit 500 may allow drive units 504, 505 to be placed effectively closer together than, e.g., conventional CBT line arrays or other line arrays without staggered drive units. The closer effective spacing of the drive units 504, 505 may improve the upper frequency response and directional control. This effect can be explained in more detail with reference to FIG. 23, which compares certain characteristics of a conventional line array 2310 using non-staggered drive units with a (slotted) dual line array speaker unit 2320 having staggered drive units. The overall length D of the line array 2310 determines the lowest frequency that can be reproduced. The length D is preferably sufficiently long to generate the desired lowest frequency. On the other hand, the spacing d between the drive units 2311 in the line array 2310 determines the maximum frequency that can be reproduced. Thus, minimizing the spacing d can be quite important to achieving acceptable high frequency response. While using smaller drive units 2311 may reduce the spacing d, doing so may negatively impact the ability to reproduce bass tones. On the other hand, using too large drive units 2311 may make d so large that high frequency response may be unacceptable. By contrast, the staggered drive units 2321, 2322 of the dual line array speaker unit 2320 effectively cuts distance d in half, thereby effectively doubling the maximum frequency that can be output without negatively affecting reproduction of the bass tones. By further making the two speaker line arrays slotted, as in FIG. 5, the effective radiating areas of the drive units 2321, 2322 can be brought closer together, minimizing the impact of having the drive units 2321, 2322 separated into two separate line arrays. Thus, overall the combination of the staggered drive units 2321, 2322 and the slotted output allows, among other things, optimal sound reproduction with a frequency range that is significantly greater than has been heretofore possible.

Another separate benefit or advantage is that the speaker unit 500 may have a narrow profile in terms of its relative sound radiating area (e.g., the area along slot 525), in comparison to, for example, a conventional CBT line array, or other speaker line arrays.

In some cases, it may be desired to have a narrower total width of the sound output slot 325 or 525 than the width of the high frequency drive units 308 or 508. For example, the high frequency drive units 308, 508 may be about 20 millimeters in width, which in some cases may be larger than desired. By placing the high frequency drive units 308, 508 slightly forward of the sound output slot 325, 525, the high frequency drive units 308, 508 may be wider than the sound output slot 325, 525 if desired. It may be desirable in such a situation to add a slight delay to the signal driving the high frequency drive units 308, 508 so that their output is synchronized with the low/mid frequency drive units, if the slight difference in output is noticeable.

In certain instances it may be desirable to increase the effective maximum frequency of the high frequency drive units 308 or 508 by staggering the high frequency drive units, using similar principles as described with respect to the low/mid frequency drive units in FIGS. 3A-3B and 5. The high frequency drive units 308, 508 may also be positioned sideways with respect to the front face of the speaker unit and paired, like the low/mid frequency drive units in FIGS. 3A-3B, such that their output is conveyed via a slot similar to the low/mid frequency drive units also. In addition, it is possible to extend the principles described herein from a two-way speaker system to a three-way speaker system, by providing separate line arrays for low frequency drive units, mid-frequency drive units, and high frequency drive units, respectively.

The high frequency drive units in any of the embodiments herein may be constructed with a speaker cone or else may, for example, be isodynamic in nature. While isodynamic drive units may have low distortion and a large radiating area, they may, depending upon their construction, have certain disadvantages (such as lower efficiency) and may be more expensive than other types of drive units.

Figure 19A:
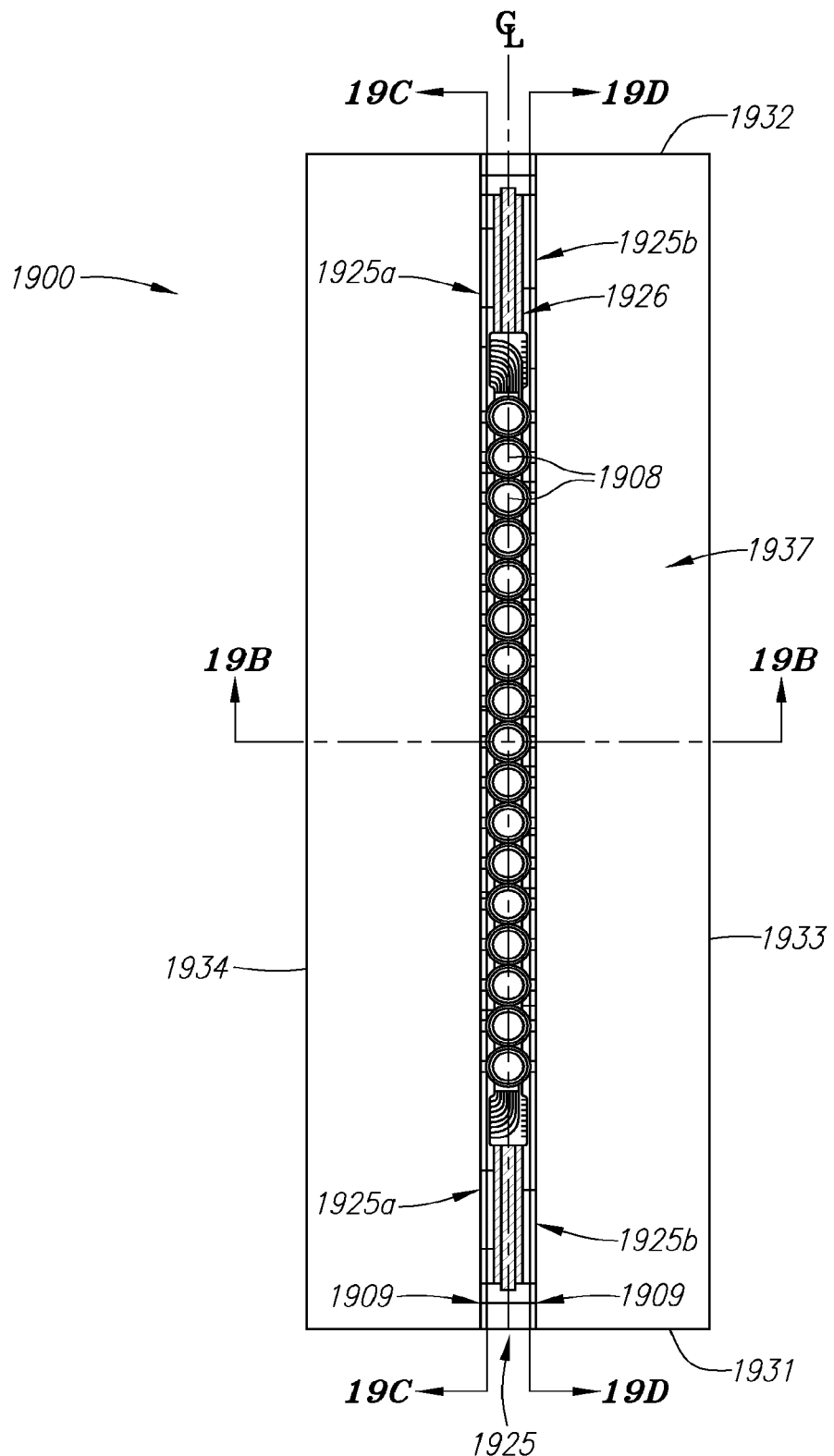
Figure 19B:
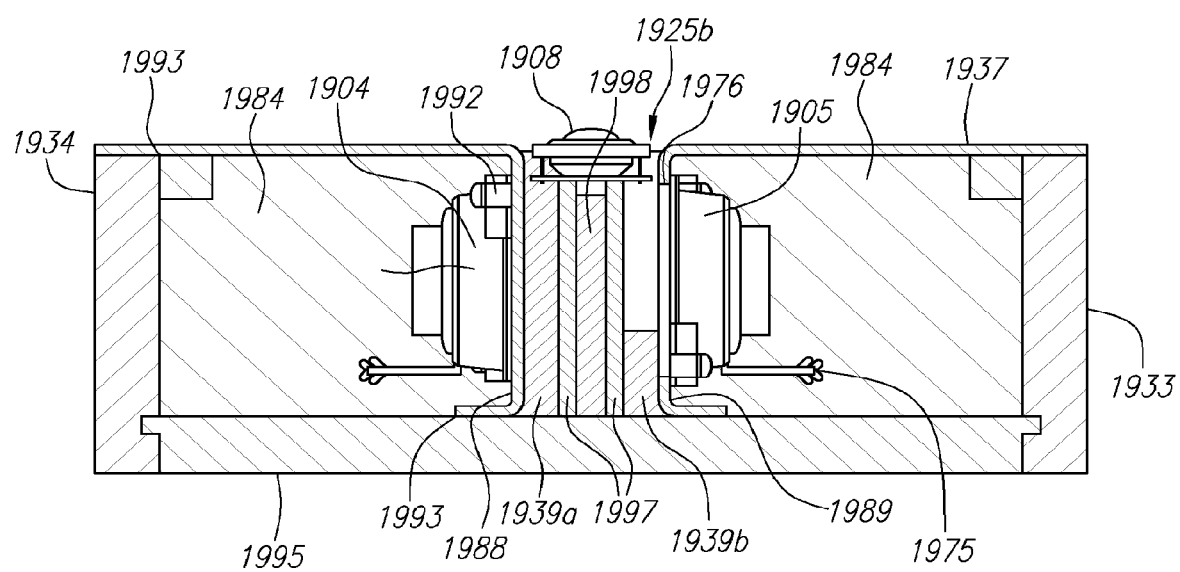

A particular embodiment of a speaker unit with staggered drive units configured according to principles described with respect to FIGS. 5 and 6, is illustrated from various viewpoints and cross-sections in FIGS. 19A-19D. In general, reference numerals 19xx represent features in FIGS. 19A-19D similar to those identified with reference numerals 5xx in FIG. 5. As shown first in FIG. 19A, a speaker unit 1900 may comprise an enclosure formed of a substantially flat faceplate 1937 (split into left and right sides in FIG. 19A), sidewalls 1933, 1934, a base wallplate 1931, a top wallplate 1932, and a backplate 1995 (as shown in FIGS. 19B-19D). The speaker unit 1900 in this example includes speaker line arrays 1914, 1915 which are depicted in FIGS. 19C (showing a cross section taken along line A-A in FIGS. 19A) and 19D (showing a cross section taken along line C-C in FIG. 19A), respectively, each speaker line array 1914, 1915 comprising an array of drive units 1904, 1905. The drive units 1904, 1905, as with FIG. 5, are preferably embodied as low and/or mid frequency range drive units, although they may also cover a different frequency range. The drive units 1904, 1905 are positioned facing one another, but staggered, and are separated by a relatively narrow and elongate sound output slot 1925. The elongate sound output slot 1925 may comprise either a single slot or series of slots, and runs along the length of the two opposing speaker line arrays 1914, 1915, providing a path for sound to be output from the low/mid frequency drive units 1904, 1905 as described previously with respect to FIG. 5 and other speaker units disclosed herein.

As further illustrated in FIG. 19A, an array of high frequency drive units 1908 may be positioned down the length of the main output slot 1925. Advantageously, the sound radiated from the high frequency drive units 1908 emanates from approximately the same location as the low/mid frequency drive units 1904, 1905, so that the sound reproduction is seamless across the frequency spectrum. If necessary, slight delays can be added to the audio signal(s) feeding the high frequency drive units 1908 in order to synchronize their acoustic output with the low/mid frequency drive units 1904, 1905. In this particular example, a dividing wall 1926 runs down the length of the main sound output slot 1925, dividing it into two parallel sound output slots (left and right) 1925a, 1925b. As with the previously described speaker units, the first sound output slot 1925a provides a path for sound to be output from the first speaker line array 1914, and the second sound output slot 1925b provides a path for sound to be output from the second speaker line array 1915.

Further details of the internals of the speaker unit are depicted in FIG. 19B, which is a cross-sectional view of the speaker unit 1900 taken along line B-B in FIG. 19A. As shown therein, a high frequency drive unit 1908 is positioned between the two sides of the front faceplate 1937, in approximately the same plane therewith (although this is not necessarily required). A left drive unit 1904 from the first speaker line array 1914 is mounted on a baffle 1988 (or other similar structure) which acoustically isolates the drive unit's forward sound radiation from its rearward sound radiation. Similarly the right drive unit 1905 is also mounted on a baffle 1989 (or other similar structure) which acoustically isolates the drive unit's forward sound radiation from its rearward sound radiation. The baffles 1988, 1989 are also illustrated in FIGS. 19C and 19D. As best depicted in those two figures, the speaker unit 1900 also preferably has acoustic absorbing material (such as compressed foam) 1939a, 1939b which is shaped so as to force the sound waves out of the output slot 1925a or 1925b, and to reduce undesired effects such turbulence and/or standing waves that may otherwise arise. In this particular example, the acoustic absorbing material 1939a, 1939b is shaped so as to separate or isolate each of the drive units 1904, 1905 from the adjacent drive units. It is also shaped so that it expands towards the opening of the sound output slot 1925a or 1925b, and so that it generally follows the rear contours of the drive unit cones. The acoustic absorbing material 1939a, 1939b is also depicted between the baffles 1988, 1989 in FIG. 19B, along with additional central sections of cut foam (or other similar acoustic absorbing material) 1997, 1998 which collectively form the dividing wall 1926 shown in FIG. 19A.

Because the drive units 1904, 1905 are staggered with respect to each line array 1914, 1915, the slot openings are likewise staggered. Thus, in FIG. 19B, the slot opening 1925b drive unit 1905 is illustrated, but at that particular cross-section the acoustic absorbing material 1939a divides two of the left drive units 1904 and thus appears to reach to the edge of where the left side output slot 1925a would be. If the cross section were taken slightly further up or down in the speaker unit 1900, the opposite situation would occur; that is, the acoustic absorbing material 1939b on the right hand side would appear to reach the each of the right side output slot 1925b, while the left side output slot 1925 would be visible.

The width of the acoustic absorbing material 1939a, 1939b in this example generally corresponds to the width of the left and right output slots 1925a, 1925b, although in other embodiments the acoustic absorbing material could be shaped or contoured as desired. In one embodiment, for example, the acoustic absorbing material 1939a, 1939b is about 10 to 12 millimeters thick; this thickness may affect the maximum desirable frequency output. In addition, acoustic damping material 1984 such as BAF wadding (which is a soft, synthetic acoustic damping material) may be placed in the enclosures between the baffles 1988, 1989 and the respective sidewalls 1934, 1933. Other features, such as gasket strips 1976, 1993 in FIG. 19B, and gaskets 1909 in FIG. 19A are also illustrated.

In the exemplary speaker unit 1900 illustrated in FIGS. 19A-19D, a total of 17 staggered low/mid frequency drive units 1904, 1905 are used, as well as 17 high frequency drive units 1908. However, any number of drive units 1904, 1905 or 1908 may be used to suit a particular application or need.

The sound processing for the speaker unit 1900 may be similar to that for FIG. 5; in other words, a sound processor constructed in accordance with FIG. 6 may be suitable to provide sound output for the speaker unit 1900.

Figures 20A, 20B, 20C, 20D:
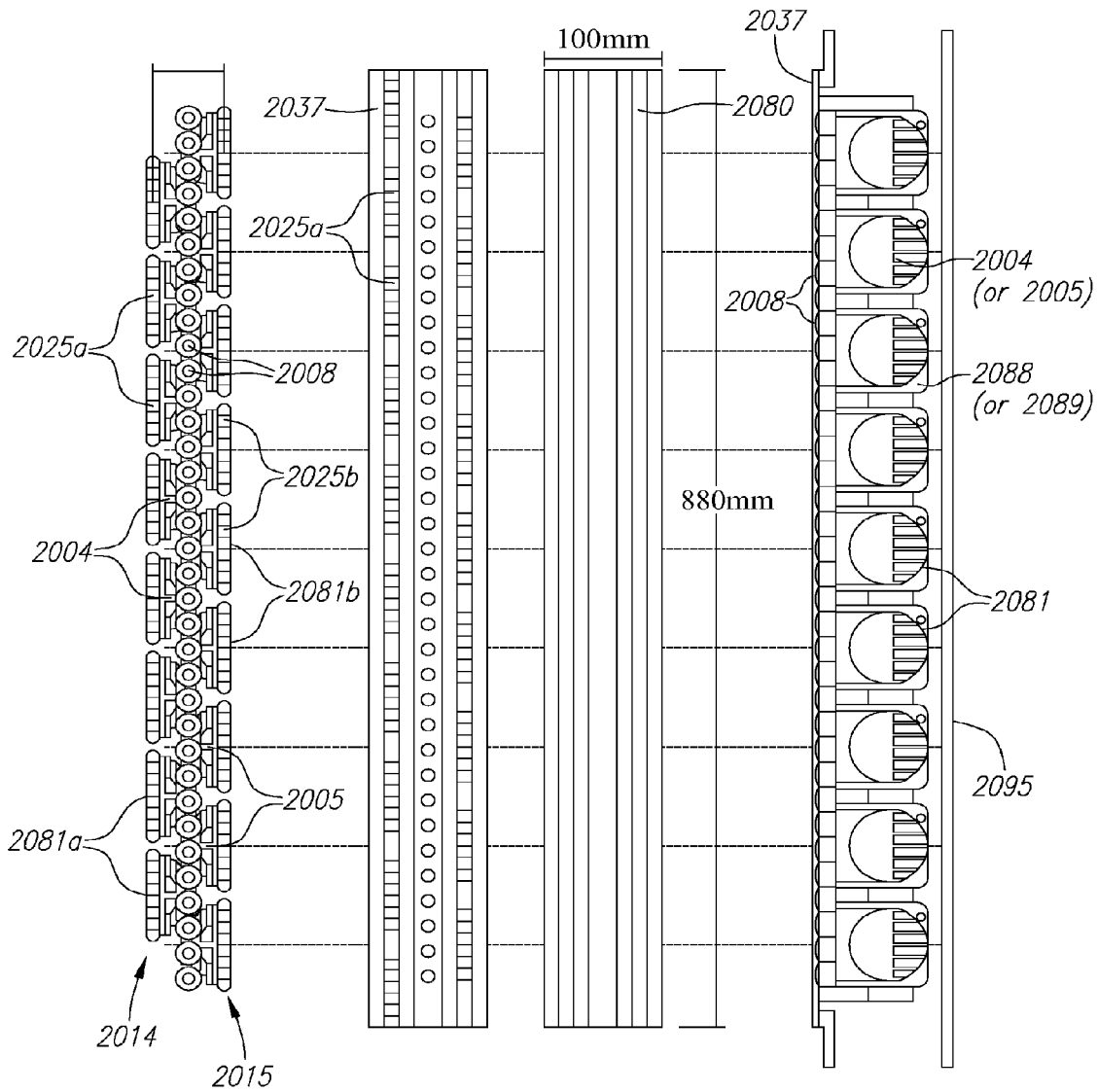
FIGS. 20A through 20F are diagrams illustrating, from different viewpoints and cross-sections, another embodiment of a speaker line array having staggered drive units.

Another generally similar embodiment of a speaker unit with staggered drive units configured according to some of the principles described with respect to FIGS. 5 and 6, and 19A-D, is illustrated from various viewpoints and cross-sections in FIGS. 20A-20E. The speaker unit in FIGS. 20A-20D is similar to speaker unit 1900 in FIGS. 19A-19D, but the drive units 2004, 2005 are reversed in orientation so that rather than facing one another they are facing away from each other. FIGS. 20A-20D are aligned so that the various features of the speaker unit are illustrated at the same relative position across the four figures, although the entire speaker enclosure is not illustrated. As shown in FIG. 20A, the speaker unit in this embodiment includes two adjacent speaker line arrays 2014, 2015 each comprising a set of drive units 2004, 2005. The drive units 2004, 2005 are preferably embodied as low and/or mid frequency range drive units, although they may also cover a different frequency range. The drive units 2004, 2005 are positioned facing away from one another, and are staggered so that the speaker line arrays 2014, 2015 can be closer together. Similar to the other speaker units, the drive units 2004, 2005 provide their acoustic radiation out of sound output slots 2025a, 2025b, which in this example are embodied as a series of slots (one for each drive unit 2004, 2005)

although a single output slot, or shared output slots, may be used as well. The sound output slots 2025a, 2025b provide a path for sound to be output from the low/mid frequency drive units 2004, 2005 as described with respect to various other speaker units disclosed herein. The sound output slots 2025a, 2025b may be constructed as part of a drive unit waveguide module 2081a or 2081b, as further described below.

As further illustrated in FIGS. 20A and 20D, an array of high frequency drive units 2008 may be positioned down the length of the center of the speaker unit, between the speaker line arrays 2014, 2015. Advantageously, the sound radiated from the high frequency drive units 2008 emanates from near the same location as the low/mid frequency drive units 2004, 2005, although not as close as the speaker unit 1900 of FIGS. 19A-19D. If necessary, slight delays can be added to the audio signal(s) feeding the high frequency drive units 2008 in order to synchronize their acoustic output with the low/mid frequency drive units 2004, 2005. A front faceplate 2037 (which may have slight contours, ridges, or the like for aesthetic purposes) is positioned in front of the speaker line arrays 2014, 2015. A foam or other sound-permeable cover 2080 may be disposed in front of the front faceplate 2037.

Figure 20E:
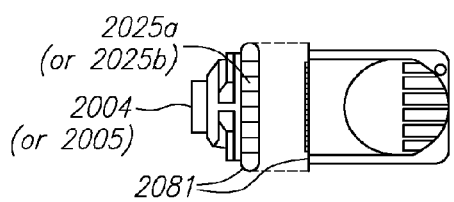
Figure 20F:
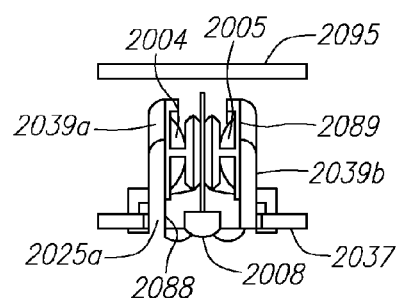

Further details of the internals of the speaker unit are depicted in FIGS. 20D, 20E and 20F. FIG. 20E depicts two different side views of a drive unit waveguide module 2081, showing the relative orientation of the sound output slot 2025a (or 2025b) with respect to the drive unit 2004 (or 2005). The drive unit waveguide module 2081 may include, for example, a mounting baffle and acoustic absorbing material surrounding the outer contours of the drive unit 2004 (or 2005) thereby directing the acoustic radiation from the drive unit to the sound output slot 2025a (or 2025b). FIG. 20D illustrates an array of drive unit waveguide modules 2081 positioned in a manner forming a speaker line array (2014 or 2015). FIG. 20D further illustrates the positioning of high frequency drive units 2008 in front of the drive units 2004 (or 2005). As an alternative to separate mounting baffles and acoustic absorbing material for each drive unit, a common mounting baffle and acoustic absorbing material may be used for the drive units, as illustrated in FIGS. 19C-19D, for example.

FIG. 20F shows a top cross-sectional view of the speaker unit, with a pair of staggered drive units 2004, 2005 oriented facing away from each other. The drive units 2004, 2005 are mounted on baffles 2088, 2089, respectively, which preferably serve to acoustically isolate each of the drive unit's forward sound radiation from its rearward sound radiation. In the cross sectional view shown, the sound output slot 2025a for the left drive unit 2004 is illustrated, with acoustic absorbing material (e.g., compressed foam) 2039a shown enclosing the sound output slot 2025a. Because of the staggering of the drive units 2004, 2005, the sound output slot 2025b for drive unit 2005 is not visible, but rather the acoustic absorbing material 2039b which defines the sides of the sound output slot 2025b is shown extending to the front faceplate 2037. In addition, acoustic damping material 1984 such as BAF wadding, may be placed as filler behind the drive units 2004, 2005. The high frequency drive unit 2008 is also illustrated in a position between the two drive units 2004, 2005.

In the exemplary speaker unit illustrated in FIGS. 20A-20E, a total of 17 staggered low/mid frequency drive units 2004, 2005 are shown, in addition to 35 high frequency drive units 2008. However, any number of drive units 2004, 2005 or 2008 may be used to suit a particular application or need.

The sound processing for the speaker unit in FIGS. 20A-20E may be generally similar to that for FIG. 5; in other words, a sound processor constructed in accordance with FIG. 6 may be suitable to provide sound output for such a speaker unit.

Figure 7:
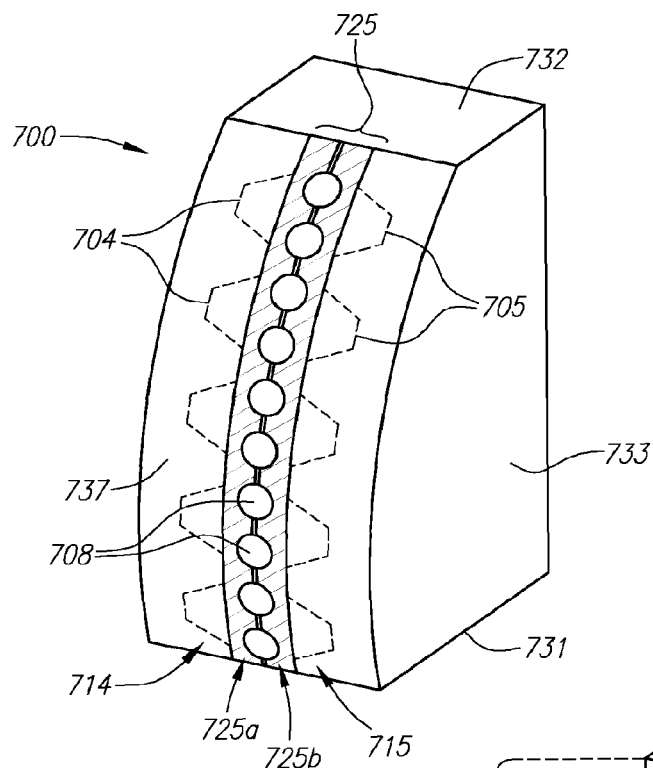
FIG. 7 is a diagram of a half-curve groundplane speaker line array having a slot for sound output.

FIG. 7 illustrates another embodiment of a speaker unit 700 configured according to principles of a speaker line array. The speaker unit 700 illustrated in FIG. 7 is similar to the speaker unit 200 shown in FIGS. 2A-2B in many respects; thus, reference numerals 7xx in FIG. 7 generally correspond to analogous features designated with reference numerals 2xx used in FIGS. 2A-2B. As with speaker unit 200 in FIGS. 2A-2B, the speaker unit 700 shown in FIG. 7 has a pair of opposing speaker line arrays 714, 715, each comprising a series of drive units 704, 705 (shown with dotted lines). A primary difference over the speaker unit 200 of FIGS. 2A-2B is that the speaker unit 700 is only the upper half of a full speaker unit, but in other respects the speaker unit 700 has a similar configuration, operation, and electronics (e.g., as shown in FIG. 4A, but with only half of the amplifiers to serve the reduced number of drive units).

The speaker unit 700 comprises two curved speaker line arrays 714, 715, in the general shape of a semi-arc, each line array 714, 715 respectively comprising a series of drive units 704, 705 (shown with dotted lines). The drive units 704, 705, as before, are preferably, but need not be, low and/or mid frequency range drive units. Similar to the speaker unit 200 of FIGS. 2A-2B, the drive units 704, 705 of the two curved speaker lines arrays 714, 15 in this example are positioned facing one another, separated by a relatively narrow and elongate sound output slot 725. The elongate sound output slot 725 provides a path for sound to be output from the drive units 704, 705. In this particular example, a dividing wall 726 runs down the length of the main sound output slot 725, dividing it into two parallel sound output slots (left and right) 725a, 725b. The first sound output slot 725a provides a path for sound to be output from the first speaker line array 714, and the second sound output slot 725b provides a path for sound to be output from the second speaker line array 715. The drive units 704, 705 are preferably mounted on a baffle or other similar structure, in a manner acoustically isolating their forward sound radiation from their rearward sound radiation. The speaker unit 700 may also have high frequency drive units 708 running down the length of the main output slot 725. Advantageously, the sound radiated from the high frequency drive units 708 emanates from approximately the same location as the low/mid frequency drive units 704, 705, so that the sound reproduction is seamless across the frequency spectrum. If necessary, slight delays can be added to the audio signal(s) feeding the high frequency drive units 708 in order to synchronize their acoustic output with the low/mid frequency drive units 704, 705.

The speaker unit 700 may have two side walls 733, 734 with a curved front faceplate 737 (which may comprise left and right sides) spanning therebetween. The curvature of the front faceplate 737 preferably follows the upper portion of an arc based on a continuous Legendre shading function, or a truncated portion thereof, as previously described with respect to FIGS. 2A-2B. The speaker unit 700 may additionally have a top wallplate 732 and a bottom wallplate 731, each interconnected to the side walls 733, 734 and the front faceplate 737. Although not shown in the illustration, acoustic absorbing material (e.g., compressed foam) is placed circumjacent to the outer rear contours of the drive units 704, 705, similar to FIG. 2B, to provide a rear barrier and thereby force the sound to be projected from the sound output slot 725. The drive units 704, 705 may be driven by electronics similar to the circuitry 400 illustrated in FIG. 4A, but with only the portion thereof needed for the upper half of the speaker unit 200 illustrated in FIGS. 2A-2B.

In operation, the speaker unit 700 functions similarly to the speaker unit 200 shown in FIGS. 2A-2B. However, when the speaker unit 700 is placed on an acoustically reflective surface (a ground plane), the lower half of the Legendre arc is effectively "restored" by the sound reflecting from the drive units 704, 705 and 708 on the reflective surface, providing that the listening distance is sufficiently far, as will typically be the case. Speaker unit 700 has the advantage of being smaller in size than other speaker line arrays, and using fewer drive units and electrical components than may otherwise be needed.

In other embodiments, speaker unit 700 could be substantially flat, with audio processing and/or delays to simulate the Legendre curvature similar to the speaker units illustrated in FIGS. 3A-3B and 5, or order to achieve a similar effect. In these embodiments, the upper half of the speaker unit such as illustrated in FIG. 3A-3B or 5 would be utilized, and the speaker unit placed on a hard or reflective surface. Alternatively, or in addition, the drive units 704, 705 in speaker unit 700 may be staggered with respect to one another, as with speaker unit 500 of FIG. 5. In such a configuration, which essentially corresponds to a full staggered speaker arrangement such as shown in FIG. 5 being "cut in half," the reflection in the ground plane will be incomplete due to the absence of a half drive unit in the bottom position of one side (either left or right) of the line array. To overcome this absence and most closely simulate a full-sized staggered speaker arrangement such as shown in FIG. 5, a phantom drive unit can be created by modifying the drive signal fed to the bottom-most drive unit in the line array, so as to create a phantom sound image of the missing drive unit. For example, supposing that the left array was "missing" the (half) drive unit at the bottom of the line array, a phantom image corresponding to the missing drive unit could be created by feeding a signal corresponding to one-half of the Legendre shading function value to the bottom-most drive unit on the right array, which is the closest drive unit to the ground plane. Due to the reflection from the ground plane, the one-half strength signal is doubled thus roughly approximating a drive unit (i.e., a phantom drive unit) centered on the ground plane. While not necessarily being identical to having a physical drive unit centered at the ground plane, this technique should result in a relatively good approximation thereof. Note that in order to have the phantom image properly integrated into the Legendre shading function, the signals to the other drive units need to be appropriately delayed with respect to the phantom drive unit, treating it as if it were a real drive unit.

Figure 8:
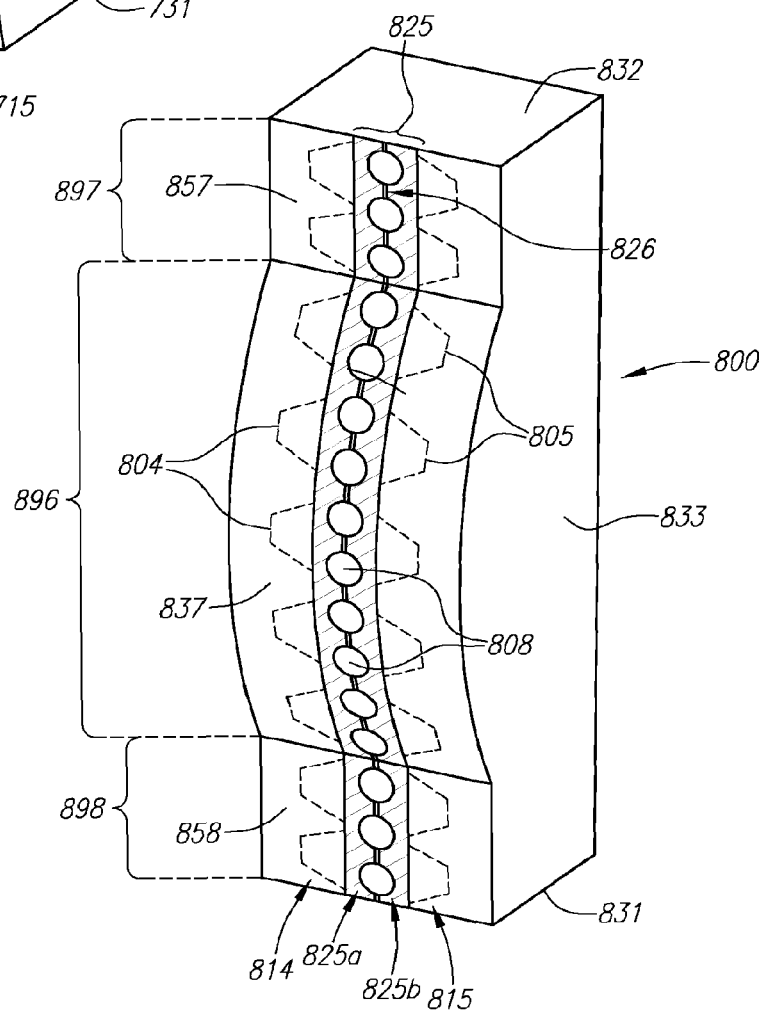
FIG. 8 is a diagram of an example of a partial-curve speaker line array, in accordance with another embodiment as disclosed herein.

FIG. 8 illustrates another embodiment of a speaker unit 800 configured according to principles of a speaker line array. The speaker unit 800 illustrated in FIG. 8 is similar to several of the previously described speaker units, and in certain respects may be viewed as a hybrid of the speaker unit 200 shown in FIGS. 2A-2B and the speaker unit 300 illustrated in FIGS. 3A-3B. Thus, reference numerals 8xx in FIG. 8 generally correspond to analogous features designated with reference numerals 2xx used in FIGS. 2A-2B and/or 3xx in FIGS. 3A-3B. Similar to speaker unit 200 in FIGS. 2A-2B, the speaker unit 800 shown in FIG. 8 has a pair of opposing speaker line arrays 814, 815, each comprising a series of drive units 804, 805 (shown with dotted lines). The central part 896 of the speaker unit 800 is curved in the same manner as the speaker unit 200 in FIGS. 2A-2B; however, the upper and lower parts 897, 898 of the speaker unit 800 are substantially flat. The drive units 804, 805 which are in the central part 896 of the speaker unit 800 may operate in a similar manner to the drive units of speaker unit 200, while the drive units 804, 805 in the upper and lower parts 897, 898 of the speaker unit 800 may operate in a similar manner to the drive units of speaker unit 300—that is, using electronic delay processing to simulate the upper and lower arced portions of the Legendre curvature (as described with respect to FIG. 4B). Alternatively, the drive units 804, 805 may not have added electronic delay processing to simulate Legendre curvature; although this may slightly reduce the advantages provided by the Legendre shaping, the difference may not be significant depending on the extent of truncation.

In one embodiment, the curved central portion 896 of the speaker unit 800 is "truncated" where the flat upper and lower portions 897, 898 begin. As a result, the overall depth of the speaker unit 800 is not as great as that of speaker unit 200, for example, which has a fully curved front face. The speaker unit 800 may therefore have certain packaging advantages, and may resemble to a greater degree a conventional flat speaker unit from an exterior physical or aesthetic standpoint. In certain embodiments, the speaker unit 800 may also have increased physical stability over speaker unit 200 in FIG. 2, and/or may use fewer electronic components or operate with simpler audio processing.

As with the other speaker line arrays, the drive units 804, 805 are preferably, but need not be, low and/or mid frequency range drive units. Similar to the speaker units of FIGS. 2A-2B and 3A-3B, the drive units 804, 805 of the speaker lines arrays 814, 815 may be positioned facing one another, separated by a relatively narrow and elongate sound output slot 825 which provides a sound output path. A dividing wall 826 may run down the length of the main sound output slot 825, dividing it into parallel sound output slots 825a, 825b, providing paths for sound to be output from the first and second speaker line arrays 814, 815, respectively. The drive units 804, 805 are preferably mounted on a baffle or other similar structure, in a manner acoustically isolating their forward sound radiation from their rearward sound radiation. The speaker unit 800 may also have high frequency drive units 808 running down the length of the main output slot 825. As noted previously, the sound radiated from the high frequency drive units 808 will emanate from approximately the same location as the low frequency drive units 804, 805, so that the sound reproduction is seamless across the frequency spectrum. If necessary, slight delays can be added to the audio signal(s) feeding the high frequency drive units 808 in order to synchronize their acoustic output with the low/mid frequency drive units 804, 805.

The speaker unit 800 may have two side walls 833, 834 with a curved center front faceplate 837 (which may comprise left and right sides), an upper front faceplate 857, and lower front faceplate 858 spanning therebetween. The curvature of the front faceplate 837 preferably follows the central portion of an arc based on a continuous Legendre shading function, or a truncated portion thereof, as previously described with respect to FIGS. 2A-2B. The speaker unit 800 may additionally have a top wallplate 832 and a bottom wallplate 831, interconnected to the side walls 833, 834 and the front faceplates 837, 857, 858. Although not shown in the illustration, acoustic absorbing material (e.g., compressed foam) is placed circumjacent to the outer rear contours of the drive units 804, 805, similar to FIG. 2B or 3B, to provide a rear barrier and thereby force the sound to be projected from the sound output slot 825.

In operation, the central portion 896 of the speaker unit 800 functions similarly to the speaker unit 200 shown in FIGS. 2A-2B, while the upper and lower portions 897, 898 of the speaker unit 800 may function similarly to speaker unit 300 illustrated in FIGS. 3A-3B. In such an example, the electronics for speaker unit 800 may be configured, for example, according to the sound reproduction circuitry 900 illustrated at a high block level in FIG. 9. It is assumed in FIG. 9 that the drive units 904$a$ . . . $i$, 905$a$ . . . $i$ correspond to their general physical position in a speaker line array such as illustrated in FIG. 8, and thus the drive units 904$a$, 905$a$ would be at the "top" of the speaker line array, while drive units 904$i$, 905$i$ would be at the "bottom" of the speaker line array. Likewise, drive units 904$a$ . . . $i$ would be on the "left" of the speaker line array (corresponding to drive units 904 in FIG. 8), while drive units 905$a$ . . . $i$ would be on the "right" of the speaker line array (corresponding to drive units 905 in FIG. 9). For purposes of explanation and illustration, the particular example of FIG. 9 uses nine pairs of drive units 904$a$ . . . $i$, 905$a$ . . . $i$, with five pairs of drive units 904$c$ . . . $g$, 905$c$ . . . $g$ located in the central portion of the speaker unit 800 and two pairs of drive units (904$a$, 904$b$ and 905$a$, 905$b$ being the first pair, and 904$h$, 904$i$ and 905$h$, 905$i$ being the second pair) being located in the upper and lower portions, respectively, of the speaker unit 800. However, the principles described with respect to FIG. 9 may be extended to additional pairs of drive units as well.

Figure 9:
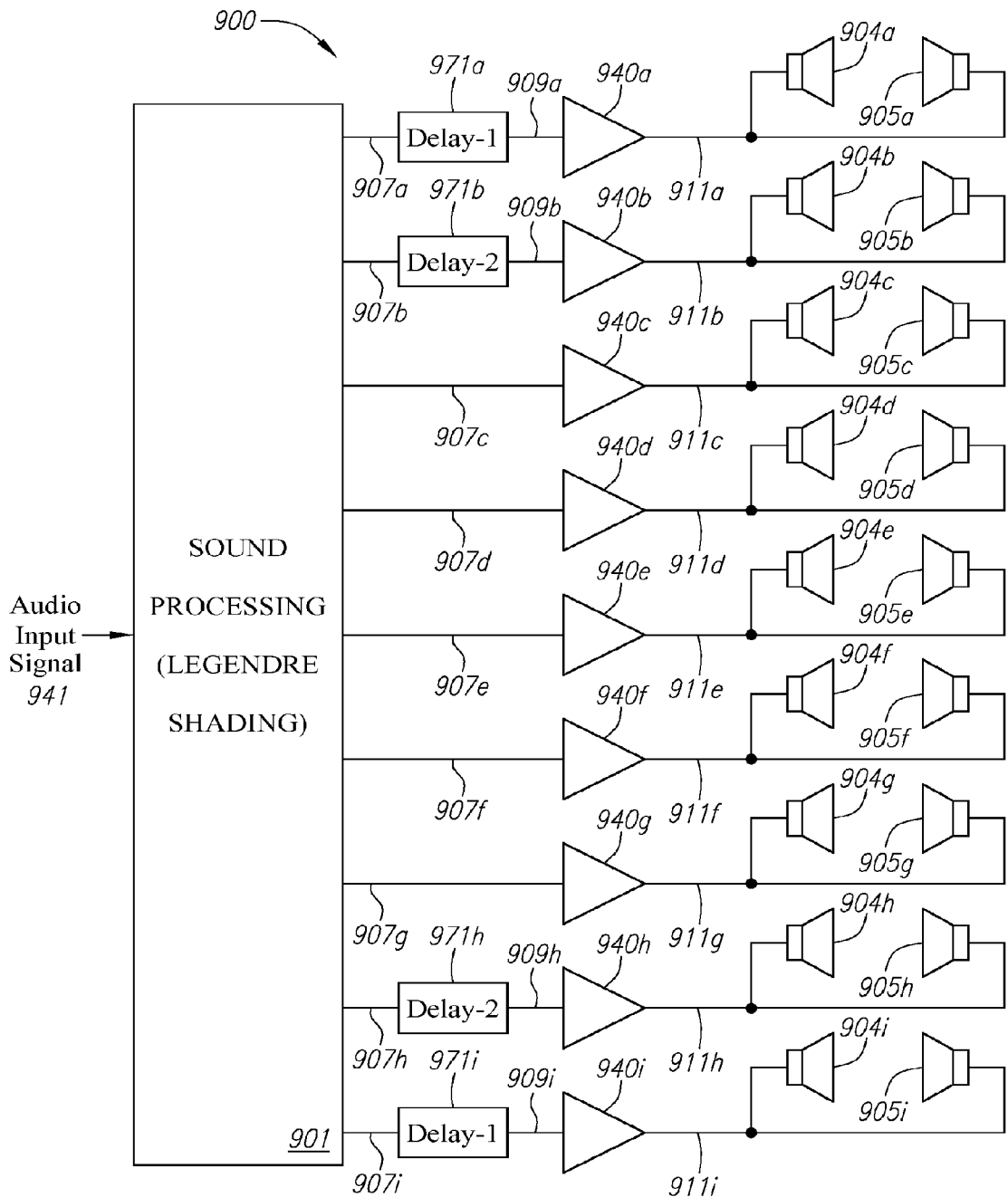
FIG. 9 is a high-level block diagram of a circuit for providing input signals to a partial-curve speaker line array such as illustrated, for example, in FIG. 8.

The circuitry 900 illustrated in FIG. 9 is a hybrid of the circuitry 400 shown in FIG. 4A and the circuitry 450 shown in FIG. 4B. Thus, similar to the system 400 of FIG. 4A, the sound reproduction circuitry 900 may include a sound processor 901 receiving an audio input signal 941, and providing a set of processed audio signals 907$a$ . . . $i$ to an array of amplifiers 940$a$ . . . $i$. Each of the amplifiers 940$a$ . . . $i$ in this example is coupled to a pair of drive units, such that the first amplifier output signal 911$a$ is coupled to a first pair of drive units 904$a$, 905$a$, a second amplifier output signal 911$b$ is coupled to a second pair of drive units 904$b$, 905$b$, and so on, up until the $i^{th}$ amplifier output signal 911$i$ being coupled to the last pair of drive units 904$i$, 905$i$.

Because drive units 804, 805 directly face each other in the particular example of FIG. 8, with each pair of opposing drive units 804, 805 being disposed at the same relative distance (and at the same relative angle) from the central plane of the speaker unit 800, each pair of opposing drive units can share the same input signal—thus, for example, the first amplifier output signal 911$a$ feeds both left drive unit 904$a$ and right drive unit 905$a$, and so forth for the other amplifier output signals 911$b$ . . . $i$ and drive units 904$b$ . . . $i$, 905$b$ . . . $i$. The amplifier output signals 911$a$, 911$b$, 911$h$, 911$i$ feeding the drive units in the upper and lower portions of the speaker array may also has an associated delay 971$a$, 971$b$, 971$h$, 971$i$ corresponding to the added distance that the soundwaves would need to travel in air if the particular drive unit 904$a$, 904$b$, 904$h$, 904$i$, 905$a$, 905$b$, 905$h$, or 905$i$ were physically positioned along the arc of the Legendre shading function, as in FIG. 2A. The amount of delay required for each drive unit is the same as explained previously with respect to FIGS. 4B and 22.

In operation, as with the circuitry in FIGS. 4A and 4B, the sound processor 901 may be configured to drive each of the amplifiers 940$a$ . . . $i$ with a different signal level that follows the continuous Legendre shading function, with the drive levels gradually tapering from maximum at the center plane of the speaker line array (i.e., drive units 904$e$, 905$e$) to near zero at the outer edges of the array (i.e., drive units 904$a$, 905$a$ and 904$i$, 905$i$). As before, the processed drive levels output from the sound processor 901 depend in part on the number of drive units 904$a$ . . . $i$, 905$a$ . . . $i$ in the speaker system, their relative size and spacing, the amount of truncation of the Legendre shading function, and the number of discrete "steps," if any, used to approximate a continuous Legendre shading function. In addition, the delay quantities introduced by delays 971$a$, 971$b$, 971$h$, 971$i$ are cumulative to the processing carried out by the sound processor 901.

While delays 971$a$, 971$b$, 971$h$, 971$i$ are shown conceptually as separate blocks in FIG. 9, it should be understood that they may be implemented in any of a variety of manners—for example, using hardware delays (which may be tunable), or by using programming the delays using digital signal processing that may be incorporated in the sound processor 901.

In other embodiments, the drive units 804, 805 of the speaker unit 800 may be staggered (similar to FIG. 5), with appropriate modification to the audio circuitry (similar to FIG. 6), or else may be a "half" unit such as described with respect to FIG. 7.

A sound reproduction system constructed in accordance with any of the embodiments illustrated in FIG. 2A-2B, 3A-3B, 5, 7, 8, 19A-D, or 20A-F, having a plurality of drive units arranged in a column or array, may provide a number of potential benefits or advantages over conventional speaker arrays or systems. For example, such a sound reproduction system may provide improved steerability, directional control, width control, and/or beam overlay capability. Some of these benefits and advantages are further explained below, in connection with various features relating to audio electronics and processing as may be used to drive or control the speaker units.

In certain embodiments, a speaker unit may be configured with an amplifier output stage integrated or collocated with the speaker unit, while the first stage of the amplifier is located remotely. The first stage of the amplifier may be embodied as part of an audio control unit which also includes command and power distribution capability. Command and/or power signals may be communicated from an audio control unit to one or more speaker units, such as speaker line arrays, which may be located at different physical locations. The speaker unit's amplifier output stage may be embodied as part of a local audio processing unit that is based on, e.g., one or more digital signal processors (DSPs) which receive and respond to the signals sent from the remote audio control unit. The command and power signals may control the speaker unit so as to provide a directional or steerable sound image, with one or more audio beams, and/or to create one or more real phantom speaker images, as further described herein. The control signals may be transmitted in any suitable format—for example, in analog form (as, e.g., pulse width modulated (PWM) signals) or as binary digital signals. The communication path between the remote audio control unit and the speaker unit's audio processing unit may be two-way in nature. In addition to controlling the output of the speaker unit, the remote audio control unit may also be able to calibrate the individual speaker units, at initial setup or before a particular audio program, using for example individual codes associated with each speaker unit. In one aspect, an intelligent controllable speaker is provided, according to certain embodiments as disclosed herein.

The power signals distributed by the remote audio control unit may be generated from a tracking power supply, and may be generally low voltage in nature, on the average, but with occasional transient excursions above the normal supply rail level when needed to drive peak sound in the audio program. It is typically desirable to have the power supply rail be two to three volts above the level of the audio signal waveform when tracking. For normal low output level conditions, the tracking power supply may default to a certain minimum output voltage. Peaks in the audio waveform, however, may run up against the normal supply rail level and cause noise and potentially lead to power inefficiencies as well. It would therefore be advantageous to raise the power supply rails as needed temporarily when the audio waveform reaches transient peak levels. Where the amplifier output stage is integrated or collocated with the speaker unit, however, it is generally undesirable to have a power supply also integrated with the speaker unit, for safety reasons and because of municipal codes. A tracking power supply in the audio control unit which distributes low average voltage power signals (but with occasional transient peaks) solves the foregoing problem by allowing the power supply to remain remotely located while providing boost power when needed by the speaker unit.

In certain embodiments, both power signals and audio signals are transmitted from the remote audio control unit to the speaker unit(s). One possible tracking power supply that may be used in the remote audio control unit is the type disclosed in U.S. Provisional Application Ser. No. 60/980, 344 entitled "Efficient Power Amplifier," assigned to the assignee of the present invention, and incorporated by reference as if set forth fully herein. The power signals typically remain at the normal supply rails, e.g., ±12-14 volts, and so they would generally be deemed low voltage signals and hence present no more safety concern than audio signals. A tracking power supply in the audio control unit may temporarily boost the supply rails when the audio waveform approaches the supply rails, but since such excursions are short the average power is not significantly affected. The fluctuations in the distributed power signals should not cause interference because they are generally low frequency in nature. Moreover, relatively narrow gauge wires can be used to carry the power signals from the audio control unit to the speaker units, since the power level on average remains low. Thus, according to certain embodiments, an amplifier output stage may be integrated or collocated with the speaker unit, in the context of a sound system having improved noise immunity, low interference, increased power efficiency, and no added safety risk.

Figure 10:
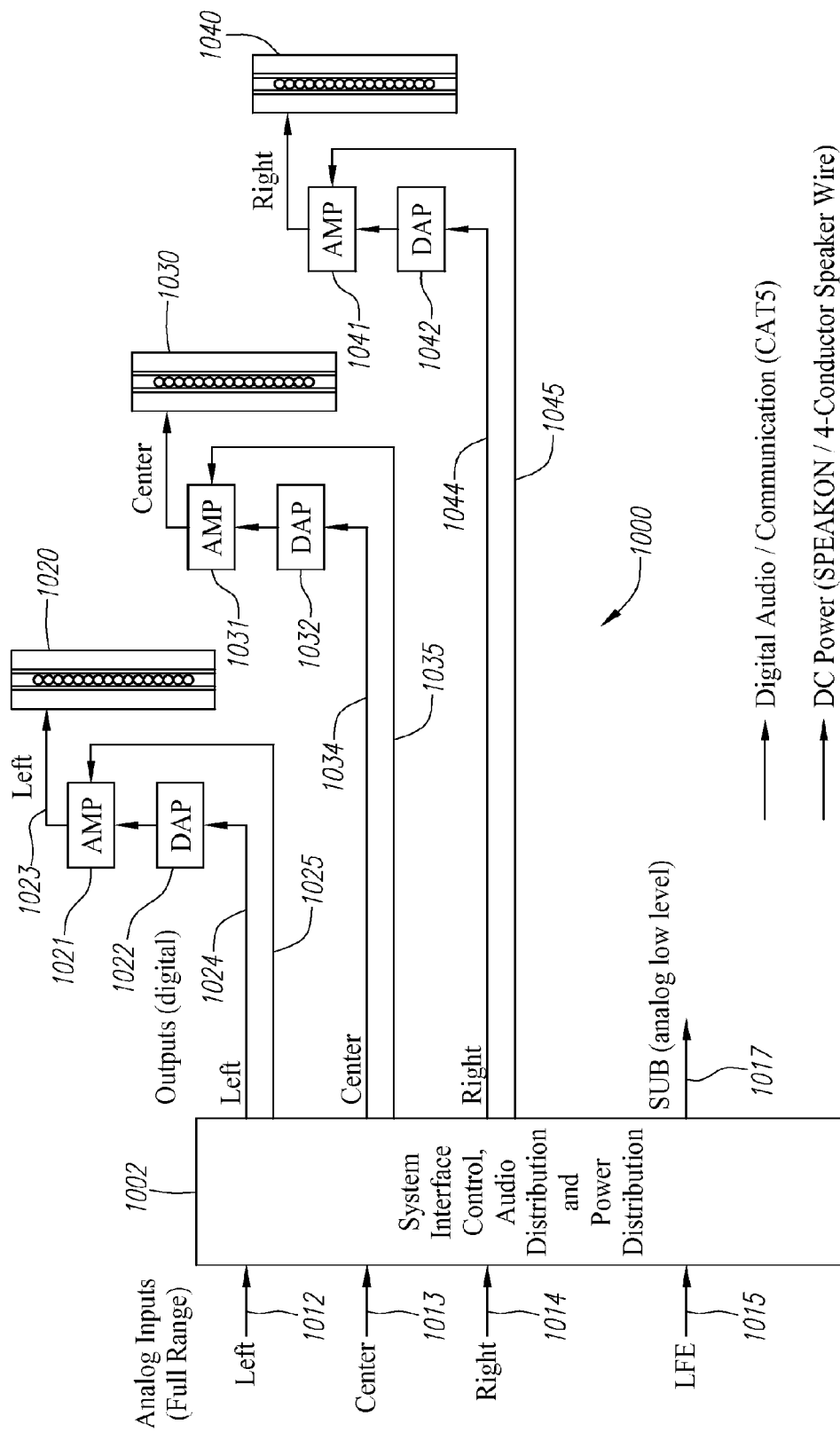
FIG. 10 is a diagram illustrating an example of a sound system using multiple speaker line arrays and power amplification stages split between a remote audio distribution unit and each of the speaker line arrays.

FIG. 10 is a diagram illustrating an example of a sound system 1000 having a remote audio control unit 1002 and multiple speaker units 1020, 1030, 1040 generally configured as speaker line arrays, with the amplification stages for the speaker units split at different locations (i.e., part of the amplification occurs at the audio control unit 1002 and part at each of the respective speaker units 1020, 1030 and 1040). The speaker units 1020, 1030, 1040 may be embodied, for example, as any of the speaker units previously described herein—such as those illustrated in any of in FIG. 2A-2B, 3A-3B, 5, 7, 8, 19A-D, or 20A-F, or any other suitable speaker unit or line array. In the particular example of FIG. 10, the speaker units 1020, 1030, 1040 are arranged as a left speaker unit, center speaker unit, and right speaker unit, respectively; however, the principles described herein are applicable to various other configurations of speaker units and any number thereof.

In FIG. 10, various audio input signals 1012, 1013, 1014 (such as left, center and right audio signals, respectively) may be provided to an audio control unit 1002. These inputs may, but need not, be analog in nature. The audio control unit 1002 may provide functions including system interface, control, audio distribution and power distribution, or any subset thereof, as well as additional functions if desired. The audio control unit 1002 may also include a low frequency effects (LFE) input 1015, which may likewise be analog in nature, and a standard power input 1016. The audio control unit 1002 may provide, as outputs, digital audio signals 1024, 1034, 1044 and associated variable power signals 1025, 1035, 1045 for the left, center and right speaker units 1020, 1030, 1040, respectively. The variable power signals 1025, 1035, 1045 may be generated by stepping down a standard wall voltage to a lower level, such as ±12-14 Volts, and using a tracking power supply of the type described, for example, in U.S. Provisional Application Ser. No. 60/980,344, previously incorporated by reference as if set forth fully herein. In such an embodiment, the power supply preferably is capable of tracking at a rate greater than the highest frequency of the audio source signal that is being amplified. Alternatively, the audio unit 1002 may include a bridge amp in conjunction with a modulated supply voltage that is lifted above the DC supply voltage when a larger output voltage swing is required. Other amplifier types may also be used, depending upon the application and the needs of the speaker unit. It may also be desirable in certain embodiments to include over-current and/or over-voltage protection circuitry in connection with the tracking power supply signals.

The ability to temporarily raise the power supply voltage above the nominal supply level, as needed, can provide a number of advantages. Among other things, a higher voltage requires less current for the same wattage, and less current in turn means that the signal cables can be thinner. Use of a tracking power supply, as opposed to a class D amplifier for example in the output stage, may avoid the need for a passive LC output filter with its associated inductor that can be hard to implement and create electromagnetic interference problems.

For the left speaker unit 1020, the audio control unit 1002 in this example provides a digital audio signal 1024 to be conveyed to a digital audio processor 1022, and a variable power signal 1025 which is conveyed to an amplifier 1021. The amplifier 1021 also receives the output of the digital audio processor 1022 and conveys a digitally processed and amplified audio output signal to the left speaker unit 1020. The center and right speaker units 1030, 1040 are likewise configured with digital audio processors 1032, 1042 and amplifiers 1031, 1041, which output processed and amplified audio signals to the center and right speaker units 1030, 1040, respectively.

In a preferred embodiment, for a given speaker unit 1020, 1030 or 1040, the associated digital audio processor 1022, 1032 or 1042 and amplifier 1021, 1031 or 1041 (referred to collectively for convenience as the speaker unit receiving electronics) are collocated with the particular speaker unit 1020, 1030 or 1040—that is, the speaker unit receiving electronics may be housed within the same enclosure as the drive units, or otherwise attached to, embedded within, or positioned nearby or adjacent to the speaker units 1020, 1030, and 1040. Digital audio signals 1024, 1034, 1044 and variable power signals 1024, 1035, 1045 are preferably conveyed over a low power speaker cable such as, for example, an ISO Category 5 ("CAT5") cable or a modified version thereof. For example, a CAT5 cable may be combined with a 4-conductor speaker wire to form a modified CAT5 cable that carries both the digital audio and communication signals (1024, 1034 or 1044) and the variable power signals (1025, 1035 or 1045) for the amplifiers 1021, 1031, or 1041. Other cable types may also be used, including cables rated for low voltage/current, depending upon the nature of the speaker system architecture.

Figure 11A:
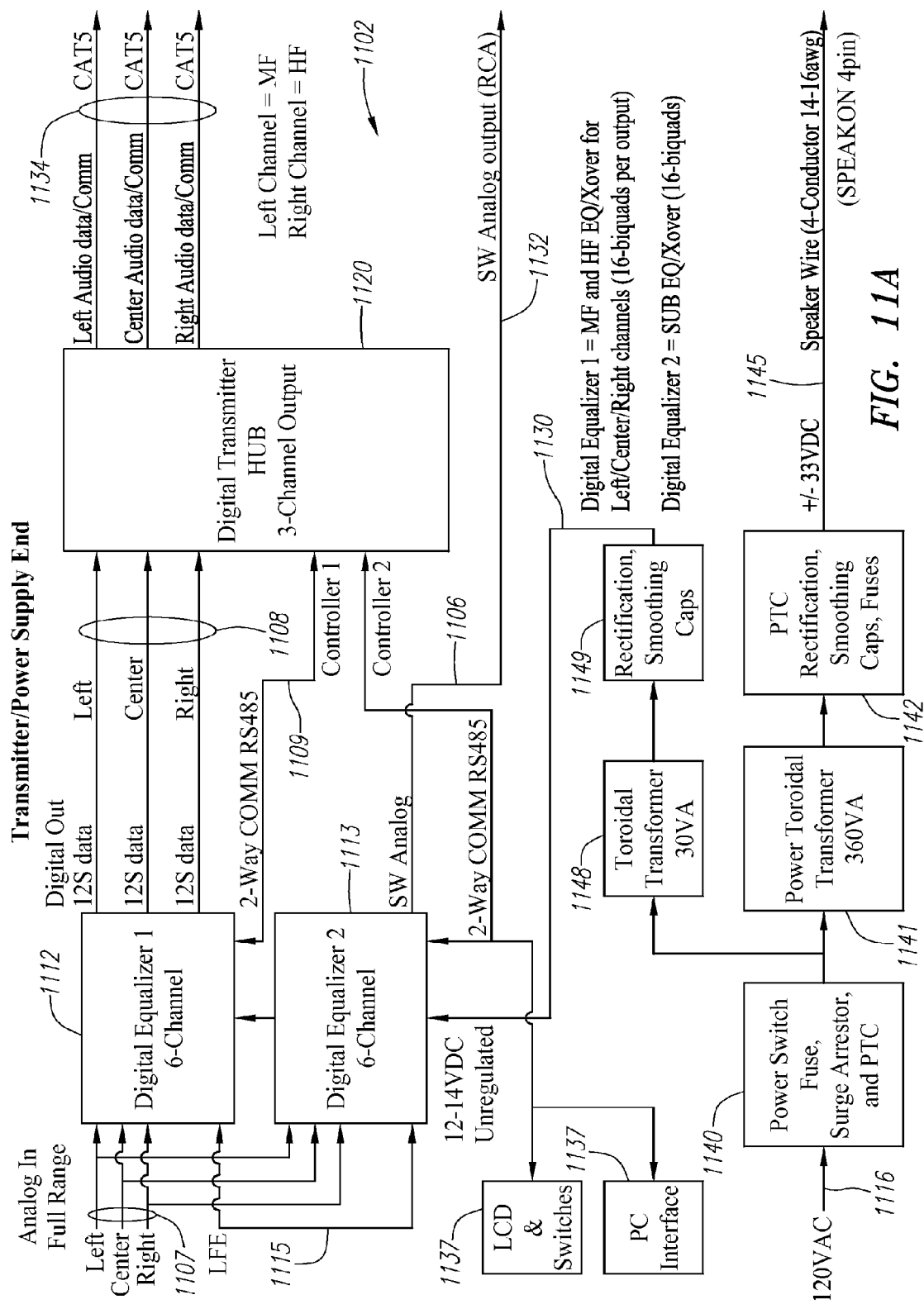
FIGS. 11A and 11B are detailed circuit block diagrams of another example of an audio sound system, including a power supply/transmitter portion in FIG. 11A and a speaker/receiver portion in FIG. 11B.
Figure 11B:
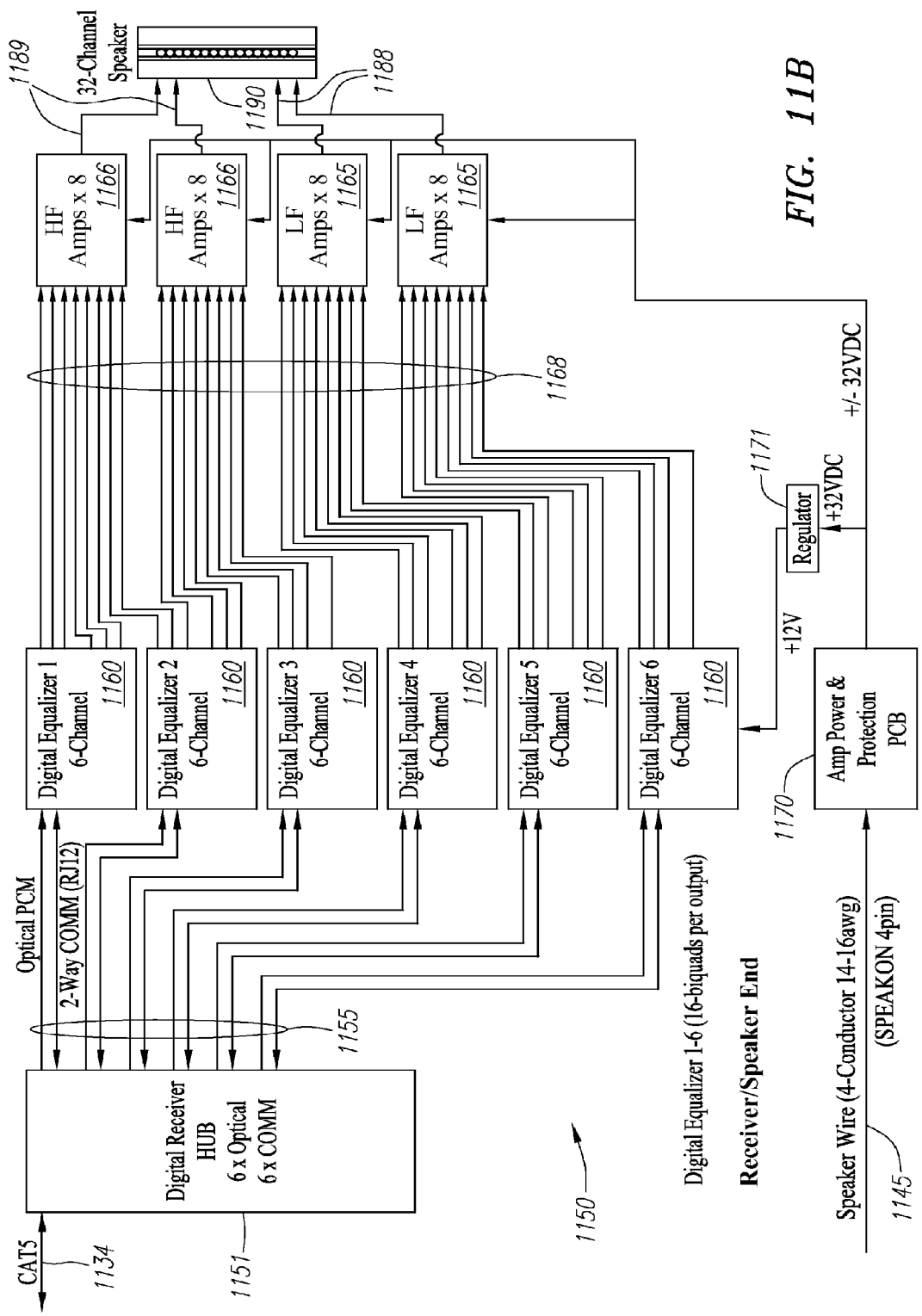

FIGS. 11A and 11B are detailed circuit block diagrams of another embodiment of an audio system, having a remote audio control unit and separate speaker unit receiving electronics collocated with one or more speaker units, according to another example. FIG. 11A is a circuit block diagram of an audio control unit portion of the sound system, while FIG. 11B is a circuit block diagram of a speaker/receiver portion of the sound system. As shown first in FIG. 11A, an audio control unit 1102 receives audio input signals 1107 which may include left, center and right audio signals, and may (but need not be) analog in nature. The audio control unit 1102 may also receive a low frequency effects (LFE) audio input signal 1115. The audio input signals 1107 and 1115 may be provided to digital equalizers 1112, 1113 for processing and effects, some of which are described later herein. Digital equalizer 1112 may output processed digital signals 1108 which may include left, center and right audio signals, and may be in a format such as I2S (which is a well known stereo audio transmission standard). The processed digital signals 1108 may be provided to a digital transmission hub 1120, which conveys audio output signals 1134 to, e.g., left, center and right speaker units similar to the speaker units (1020, 1030 and 1040) illustrated in FIG. 10. The audio output signals 1134 may include left, center and right audio data, and may be converted to a format such as CAT5, or other signal format as may be used in the system.

The other digital equalizer 1113 may output a subwoofer (SW) analog output signal 1132, and may also provide interfaces to an LCD and switches 1137, or a host computer (PC) interface 1137. The digital equalizers 1112, 1113 may communicate internally with the digital transmission hub 1120, LCD and switches 1137, and host computer interface 1137 via, e.g., a two-way communication protocol such as the standard RS485 protocol, as indicated by communication and control signals 1106, 1109. An incoming power signal 1116 may be provided to a power input module 1140 which may include, e.g., a power switch, fuse(s), surge arrestor, and/or auto-resetting overload protection (PCT) circuitry. The power input module 1140 may be coupled to a first transformer 1148 which provides 12-14 volt unregulated DC power to other components in the audio control unit 1102, in conjunction with rectifiers and/or smoothing capacitors 1149 if necessary. The power input module 1140 may also be coupled to a second transformer 1141 which provides a speaker power output signal 1145 that may be conveyed, e.g., to the various speaker units 1020, 1030, 1040. In this example, the speaker power output signal 1145 may have a swing of approximately ±33 volts DC, and may physically comprise multiple (e.g., four) conductors/wires.

Turning now to FIG. 11B, a receiver electronics unit 1150 may be associated with each speaker unit 1190, in a general system configuration similar that illustrated in FIG. 10 with left, center and right speaker units 1020, 1030, 1040. In other words, while the components for only a single speaker unit 1190 are shown in FIG. 11B, additional speaker units can be similarly constructed in the context of a larger audio system. The receiver electronics unit 1150 in the example of FIG. 11B may include a digital receiver hub 1150 for receiving and distributing the audio output signals 1034 from the audio control unit 1102 (FIG. 11A). The digital receiver hub 1151 may output digital audio/control signals 1155 to an array of digital equalizers 1160, each of which may have a plurality of channels (e.g., six channels). Digital audio/control signals 1155 may include one or more unidirectional optical pulse coded modulation (PCM) signal(s) and one or more two-way communication/control signal(s) carried over, e.g., an RJ12 connector or any other suitable connector.

The digital equalizers 1160 interpret any control information conveyed by digital audio/control signals 1155 and apply appropriate pre-processing—for example, to create some of the steering, shading, delay or other effects described herein. The digital equalizers 1160 may also convert the encoded digital audio data to analog form, and provide processed analog audio signals 1168 to one or more low frequency amplifiers 1165 and one or more high frequency amplifiers 1166. The low frequency amplifiers 1165 drive the individual low/mid frequency drive units of the speaker unit 1190, while the high frequency amplifiers 1166 may drive the high frequency drive units of the speaker unit 1190. The digital equalizers 1160 may provide delay signals to simulate a curved line array shape and/or for Legendre shading, as previously described herein. Alternatively, as likewise previously described, passive means may be used for this purpose, thereby reducing the number of amplifiers required. For example, each drive unit's sensitivity may be individually designed to match that required for a particular position in the array (aided in part by either series or parallel connection of the drive units in an opposing pair configuration). Alternatively, or in addition, a passive attenuating network may be placed in series with the amplifier and a given drive unit. Similarly, a passive delay network may also be used in series with an amplifier and a particular drive unit, tailored to the delay required for a particular location in the speaker line array for simulating a curved line array.

The receiver electronics unit 1150 may further include power electronics for receiving and distributing the power output signal 1145 from the audio control unit 1102. In a particular preferred embodiment, the receiver electronics unit 1150 may drive up to 32 channels; however, smaller or larger arrays may be created as necessary for various applications. The power electronics may include an amplification module 1170 (which may comprise a power amplifier and protection circuitry) and may further include a voltage regulator 1171. The voltage regulator 1171 may provide regulated or unregulated low voltage (e.g., 12-volt) DC power to the digital equalizers 1160. The amplification module 1170 may distribute the incoming power to the various amplifiers 1165, 1166. The amplification module 1170 may comprise, for example, a variable or modulated supply voltage that tracks the audio input signal and temporarily boosts the positive and/or negative supply rails for peak audio swings, such as may be provided by any of the tracking power supplies described in U.S. Provisional Application Ser. No. 60/980,344, previously incorporated by reference.

In alternative embodiments, the amplification module 1170 may be moved upstream to the transmitter/power supply components of the audio control unit 1102 of FIG. 11A and combined therewith. In such a case, the audio control unit 1102 may be configured to output one or more relatively low voltage variable power supply signals (using a tracking power supply as described above) for distribution to the various receiving electronics of the speaker units (FIG. 11B), similar to the technique(s) described earlier with respect to FIG. 10. In such a case, it may be possible to combine the variable power supply signals with the signals being transmitted over the CAT5 or other cables to the speaker units.

Figure 12:
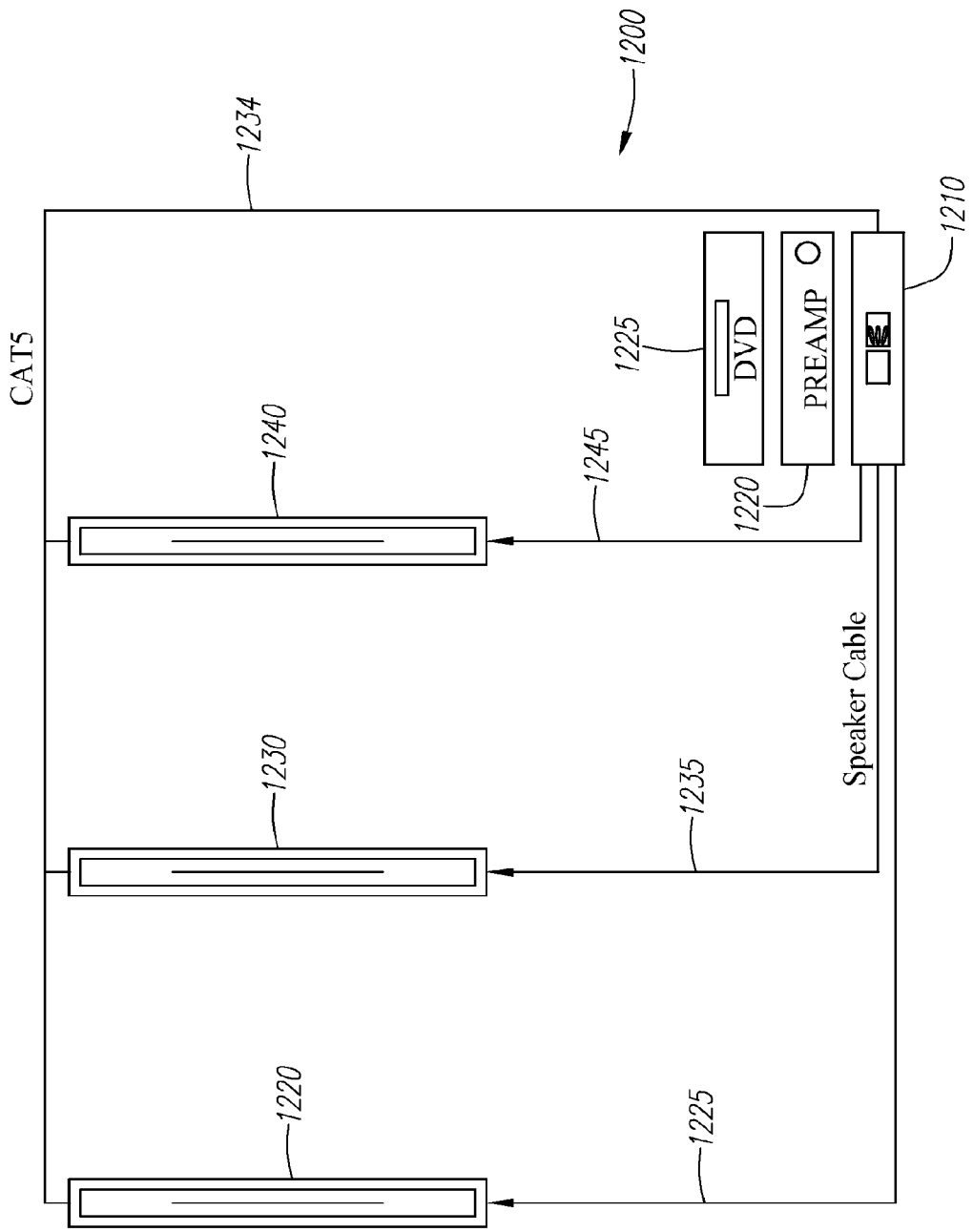
FIG. 12 is a high level diagram of various components of a sound system in accordance with the example illustrated in FIGS. 11A-11B.

The electronics for the audio control unit 1002 (FIG. 10) or 1102 (FIG. 11A) may be provided, for example, in a standalone audio component housing similar to a conventional DVD or CD player, receiver, or the like. FIG. 12 is a high level diagram illustrating an audio control unit 1210 along with other possible components of a sound system 1200, shown for purposes of illustration only and not limitation. In this example, a DVD player 1225 and preamplifier 1220 are provided in the sound system 1200. The audio control unit 1200 is shown connected to left, right and center speaker units 1220, 1230, 1240 via a combination of CAT5 cable(s) 1234 and 4-conductor speaker wire 1225, 1235, 1245 serving the left, center, and right speaker units 1220, 1230, 1240, respectively. Although conceptually shown as separate cables, the CAT5 cable(s) 1234 and 4-conductor speaker wire 1225, 1235, 1245 may be combined individually for each of the three speaker units 1220, 1230, and 1240, or other alternative cables or wires may be utilized if desired.

In some cases it may be desirable to provide a composite speaker unit that can be constructed of individual modular components. For example, one or more basic modular sub-arrays of drive units, each being substantially identical in configuration, can be physically connected together to form a larger speaker line array. In this manner, different sizes of speaker line arrays can be created from the same base components. If desired, each of the modular sub-arrays can be constructed with its own amplifier output stage and audio processing electronics, so that each sub-array is independent although there may be an audio control unit that sends each sub-array the appropriate audio information or instructions for proper sound reproduction in accordance with the principles already described herein. As one example, a modular sub-array may be approximately 765 mm in length, with 70 mm low frequency drive units placed 90 mm apart (center to center). In this example, a total of eight low frequency drive units are placed on each of the left and right arrays, for a total of 720 mm for each array, but where the left and right arrays are staggered the total length of the modular sub-array is around 765 mm. Because of the staggering of the left and right arrays, the modular units may be constructed with a removable cap on each end (e.g., a top cap on the left array side and a bottom cap on the right array side); when placing two sub-arrays together, the top cap would be removed from the lower sub-array and the bottom cap from the upper sub-array. In this manner, no interruption occurs in the staggered line array pattern. Any number of sub-arrays may be combined in this fashion to form a larger speaker unit.

In an alternative embodiment, two speaker linear arrays may be combined with one line array vertically oriented and the other horizontally oriented, in, for example, an "X" pattern in which the two arrays overlap in the middle. The individual line arrays may be controlled in accordance with techniques described herein, to provide a two-dimensional array with controllable directivity based on two one-dimensional line arrays.

Various effects as may be created with speaker units or line arrays constructed in accordance with certain embodiments disclosed herein will now be further described. In a particularly versatile configuration of a speaker unit or line array, all the drive units in the line array are separately addressable by multi-channel DSP, and preferably integrated with power amplifiers, that can thereby provide effects such as control of audio beamwidth and/or steering, as further explained below, and/or creation of multiple audio beam overlays of distributed "equivalent speakers" (or virtual speakers) from a single speaker unit or line array. Examples of the foregoing effects may be explained with reference to FIGS. 14A through 18. In the context of those figures, the term "speaker line array" will be used to refer to speaker unit configurations such as generally depicted in any of FIGS. 2A-2B, 3A-3B, 5 and 8, as well as other variations including potentially a single linear speaker array using DSP processing according to techniques explained herein to steer or otherwise control the audio output in the manner described.

Figure 14A:
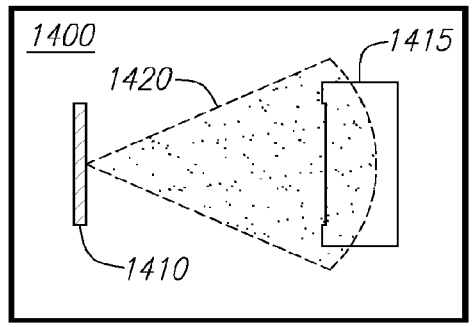
FIGS. 14A and 14B are conceptual diagrams illustrating the tailoring of sound beam width using a speaker line array.
Figure 14B:
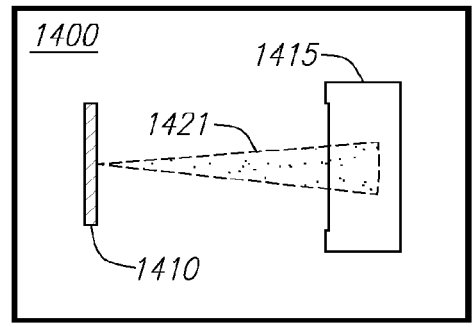

FIGS. 14A and 14B, for example, are conceptual diagrams illustrating the tailoring of audio beam width using a speaker unit in the form of a speaker line array. In the example of FIGS. 14A and 14B, a speaker line array 1410 is provided in a listening area 1400 (such as a media room, home theater, cinema, recording studio, etc.) with the expected audience seating 1415 as shown. The speaker line array 1410 is illustrated in this example as a flat speaker unit that is positioned horizontally. If having a slotted output as described previously in connection with various embodiments, the speaker line array 1410 may advantageously be embedded within a wall or mounted thereto; alternatively the speaker line array 1410 may be placed on a stand or otherwise conventionally mounted. Through digital processing using, e.g., DSPs, the width of the audio beam projected by the speaker line array 1410 may be adjusted, and may, for example, be controlled to be a wide beam 1420 (as in FIG. 14A) or a narrow beam 1421 (as in FIG. 14B). Control of the beam width is based on selection of the appropriate Legendre parameters, as is known in the art. The selection of beam width may be instigated by manual selection of a control option available via an audio unit (such as an amplifier/receiver or surround sound audio unit). Alternatively, the beam width may be modified dynamically, or in real-time, in response to control information in the audio source material or based upon an evaluation of the audio source material.

The audio beam width can be tailored to suit different acoustic conditions. For example, narrow beams may be useful with live speakers or where there is substantial dialog, so as to improve voice intelligibility. On the other hand, wide beams provide more complete coverage and enhance the perception of spaciousness. The control of the audio beam characteristics, including beam width, can be real-time or else pre-programmed with the source audio data.

Figure 15A:
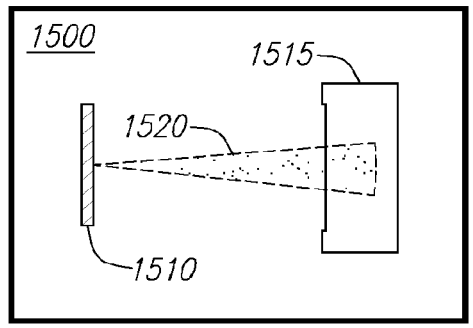
FIGS. 15A through 15D are conceptual diagrams illustrating the steering of a sound beam using a speaker line array.
Figure 15B:
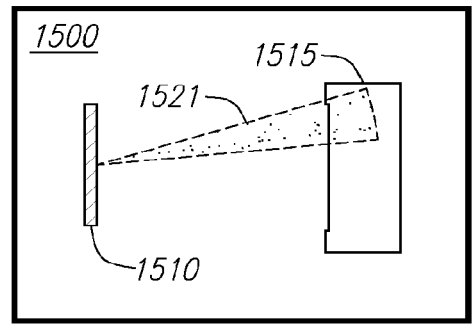
Figure 15C:
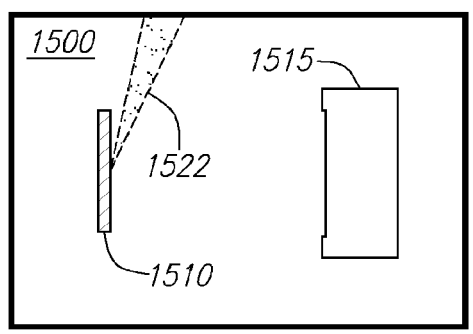
Figure 15D:
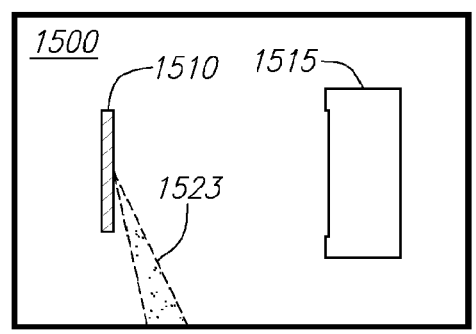

Besides having control of the audio beam width, the speaker line array may also provide steerability of the audio beam. FIGS. 15A through 15D are diagrams illustrating examples of steering of an audio beam using a speaker line array 1510. FIG. 15A shows the situation where the audio beam 1520 is directed down the center of the listening area 1500 towards the expected audience seating 1515. FIG. 15B shows the situation where the audio beam 1521 is directed to one side of the expected audience seating 1515. FIGS. 15C and 15D illustrate situations where the audio beams 1522, 1523 are directed to the far left and right sides, respectively of the expected audience seating 1515. To steer an audio beam, the audio processor (such as 1022, 1032, 1042 in FIG. 10, or the electronics of FIG. 11B) adjusts the timing of signals to various drive units. More specifically, the audio processor adjusts the delay amount to each drive unit, effectively moving some drive units further back and some drive units closer to the target area—conceptually similar to the simulation of a curved surface through use of graduated delays as described previously with respect to FIG. 22. The amount of delay adjustment for each drive unit may be readily calculated based upon the desired steering angle, given the overall length of the line array (or sub-array) being steered and the relative position of each drive unit in the line array. Generally, the center drive unit in the array or sub-array being steered will have a delay adjustment of zero (as it acts as the "pivot" point), while the amount of delay adjustment should be symmetrical around the center drive unit, with positive delay amounts on one side of the center drive unit and negative delay amounts on the other side.

Audio beam steering may be used to direct the sound of any channel of the speaker line array either toward or away from any listening position. Narrow audio beams useful for intelligibility in live rooms can be directed toward a listener sitting away from the main or central axis of the speaker line array 1510. Audio beams can be directed sharply away from the listeners to, for example, decrease direct/reflected sound ratio and/or to improve the sense of ambience.

Figure 16A:
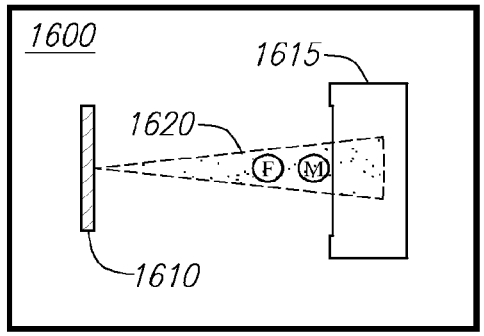
FIGS. 16A through 16D are conceptual diagrams illustrating the generation and steering of multiple sound beams using a speaker line array.
Figure 16B:
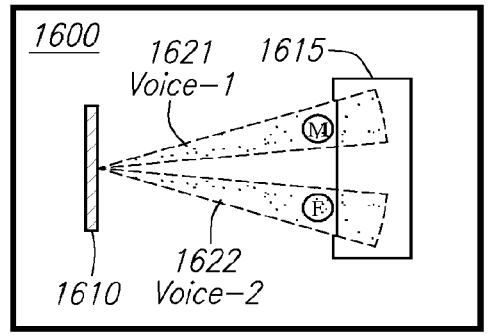
Figure 16C:
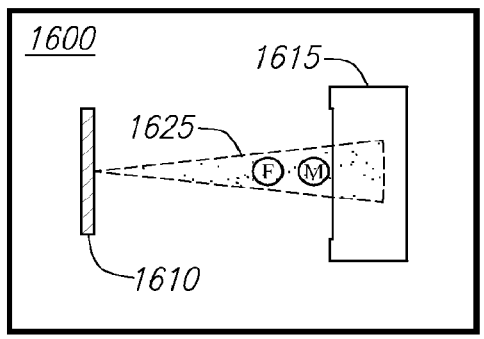
Figure 16D:
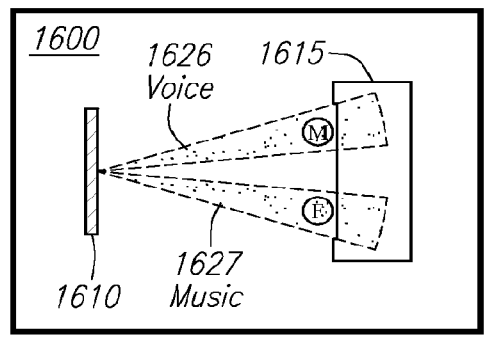

Since the speaker line array has a large number of channels, more than one audio beam may be generated and controlled or steered from a single speaker line array, as illustrated in FIGS. 16A-16D, and the audio beams may be non-overlapping, partially overlapping, or fully overlapping, and may have the same or different program content. For example, FIG. 16A illustrates a situation where two audio beams (represented collectively by 1620), such as two audio vocal tracks, output from a speaker line array 1610 are fully overlapping; whereas FIG. 16B illustrates the situation where the two audio beams 1621, 1622 are steered to different sides of the expected audience seating 1615 in the listening area 1600. FIGS. 16C and 16D represent the analogous situations as FIGS. 16A and 16B, respectively, except with respect to a vocal track 1626 and music track 1627 instead of two vocal tracks. Although the examples are illustrated with two audio beams, the same concept can be expanded to an arbitrary number of audio beams.

The ability to generate and separately steer multiple audio beams may provide a number of advantages and benefits. For example, dialogue and music or special effects are often directed to the center channel, making dialogue difficult to hear unless volume is raised which increases total loudness; however, by steering the two components in different directions the ear/brain can readily separate them and listen to either at will, without the need to raise the overall loudness.

Figure 17:
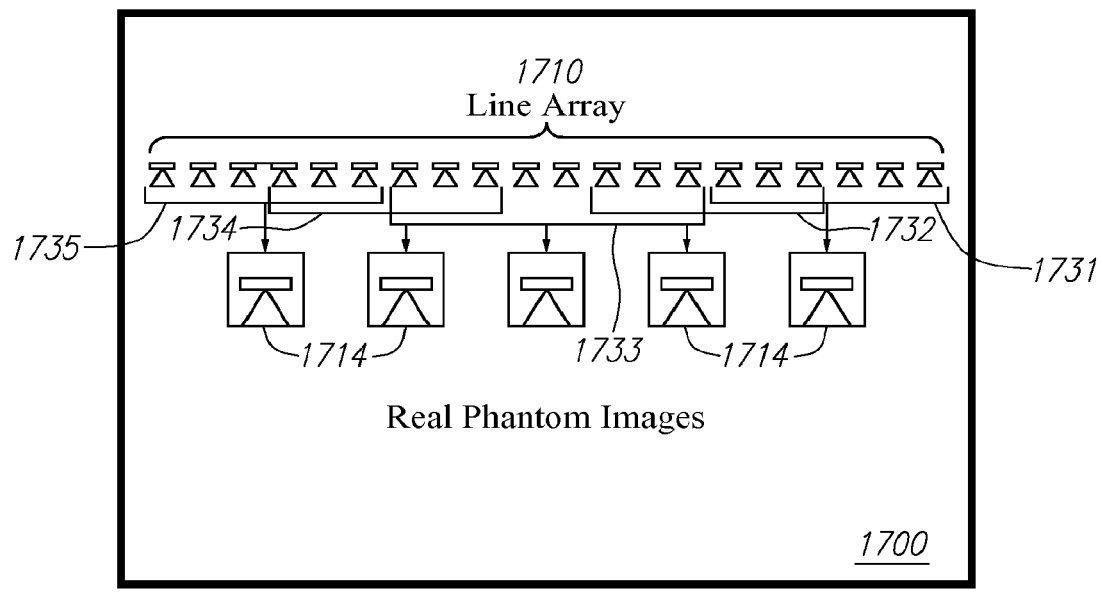
FIG. 17 is a conceptual diagram illustrating generation of "real" phantom images using a speaker line array.

The ability to separately address all the drivers in a line provides another opportunity for an improved listening experience especially with regard to stable imaging. The most common way to provide more stable and believable imaging, particularly in front of the listener, is to have more speakers. The ability of the inventive speaker line array to reproduce many different overlaid beams can be used to simulate the effect of having multiple spatially separate speakers—which may be termed "real phantom images"—created from sub-arrays of drive units within a single horizontal speaker line array. These equivalent or simulated speakers not only may occupy separate physical positions across the sound stage, but also can each possess different directional characteristics and be fed from separate sound channels. FIG. 17 is a conceptual diagram illustrating generation of real phantom images from equivalent or simulated speakers using a speaker line array 1710. As shown in the example of FIG. 17, five different groups 1731-1735 (some overlapping) of contiguous drive units within the speaker line array 1710 are combined in to create five real phantom images 1714. The DSP processing associated with the speaker line array 1710 is configured to treat each group 1731-1735 of drive units as a cohesive unit, and thereby provides the effect of having five spatially separate speaker units and a broader, more stable sound stage.

According to certain aspects of the above described embodiment, it is generally possible to create an increased number of spatially separate real phantom images at any position within the width of the speaker array line. This effect is achieved by creating sub-arrays from the drive units within a single, long horizontal array 1710. The number of phantom images is limited in practice to about 90% of the drive units the horizontal speaker line array 1710. Also, in practice, due to the limited angular resolution of the ear it is unlikely that any increase in the number of real phantom images is needed for adjacent pairs to subtend an angle of, e.g., less than 2-3 degrees at the listener.

Similarly, the use of the speaker line array 1710 may increase the number of apparent channels in the system. Currently the maximum number of front and surround channels in a standard format is limited to seven, but through the process of up-mixing it is conceptually possible to undertake a spatial re-sampling process that increases the number of channels from seven up to a maximum approaching that of the total number of drive units in the speaker line array 1710. In practice this is unlikely to be needed, but an increase from seven to, e.g., twenty or thirty would be readily achievable and the benefit immediately apparent in terms of image position and stability. These additional channels of information needed to drive the sub-arrays could be provided in a number of ways. For example, the additional channels of information could be obtained by spatial up-sampling of existing 5.1-7.1 program or source data. This process could be carried out by providing directional and ambient cues for each channel. During the original mixing process, such information may be contained in metadata accompanying the audio program. After the original mixing process, the ambient and directional cues may be separated from an existing 5.1-7.1 program down-mix. A spatial up-sampling technique has already been developed for up-mixing from stereo to 5.1 and could be adapted for up-mixing from 5.1. For each of the up-sampled channels the estimated spatial position and ambient content could be used to create a separate overlay assigned to a sub-array in the horizontal speaker line array 1710. Besides spatial up-sampling of existing 5.1-7.1 program data, the additional channels of information might be obtained in certain circumstances from an original multi-channel master stored with sufficient channels to provide a separate audio channel for every drive unit or sub-array.

Figure 18:
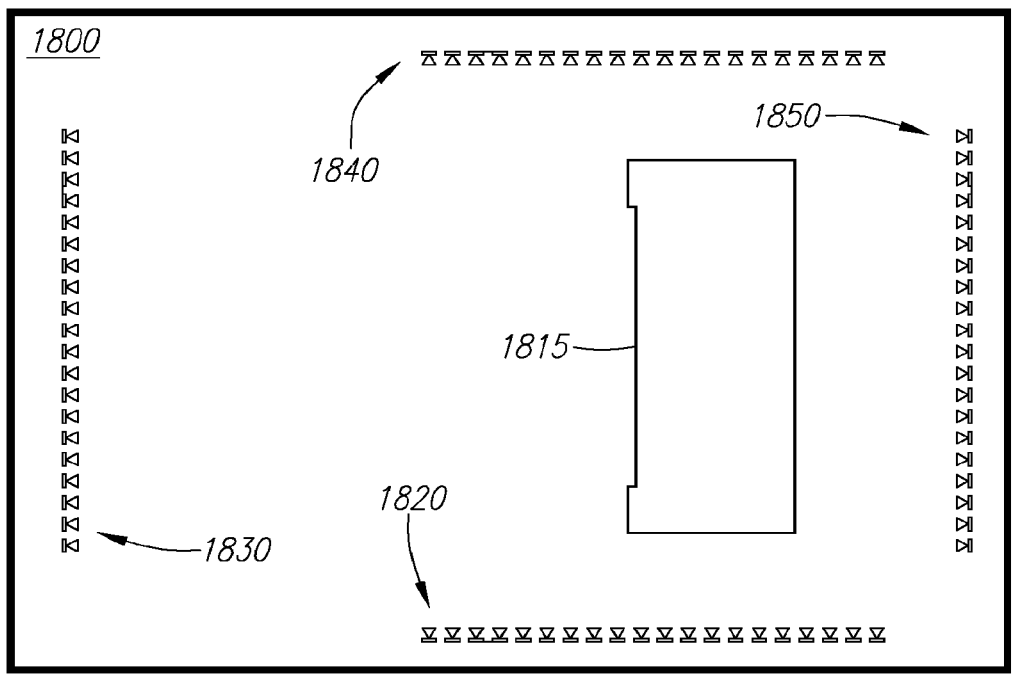
FIG. 18 is a diagram illustrating an example of a configuration of multiple horizontal speaker line arrays in a home theater sound system.

A full playback system in a home theater environment, for example, might consist of four long speaker line arrays mounted horizontally on (or within) each wall—front, back and either side. FIG. 18 is a diagram illustrating an example of such a configuration, with speaker line arrays 1820, 1830, 1840 and 1850 surrounding the expected audience seating 1815 on all sides. Such an arrangement should be capable of producing a near 3-D horizontal image that is both stable and accurate over a wide listening area. The sound system, and each speaker line array 1820, 1830, 1840, 1850 therein, may be programmed or tuned at setup time to take advantage of the particular nature of the room 1800.

A speaker line array according to various aforementioned embodiments may provide advantages such as improved intelligibility under live conditions by varying beam width; improved intelligibility under live conditions by overlaying separately steered beams; creating a larger sweet spot by steering or beam widening, and reducing timbral coloration by reducing unwanted reflection. In one aspect, controllable directivity is utilized by the speaker line array to minimize the effects of speaker/room interaction.

Speaker units or line arrays constructed according to certain embodiments and variations disclosed herein may find a wide range of commercial, consumer, and practical applications. As one example, speaker units or line arrays as described herein may be advantageously utilized for providing cinematic sound systems as used in, e.g., movie theaters and the like. Front speaker line arrays can provide wide coverage for substantially all of the seats in a theater, in addition to providing improved dialog intelligibility and sound quality even at relatively low playback levels. Speaker line arrays arranged in a surround configuration may provide more realistic ambient effects as well as rear directional cues simultaneously from the same physical array. Also, separate beams can be used for dialog and effects; this allows, for example, the audio effects volume to be suppressed slightly (if desired) in the center channel, where the dialog audio is output, while keeping the effects at normal volume in the right and left channels where it is less likely to interfere with dialog. For large speaker line arrays positioned on the sides of a theater, fore and aft effects could also be realized, if desired by the sound designer or mixer.

Another application for speaker line arrays is in home theater sound systems. For example, speaker line arrays—particularly those using sound output slots—may allow a slim forward speaker profile, enabling less conspicuous speakers to be installed on or in the wall, and may act as direct replacement for existing 5.1 surround systems. Many more seating positions can be used in the home theater area without compromising sound timbre or imaging. Shaped and directed beams can minimize undesired room effects. The system can adjusted or programmably tuned to suit the customer's requirements with regard to speaker placement and listening position. Most audio formats could be correctly replayed over, e.g., a four-line horizontal array without the need to change the speaker layout for different audio formats. For example, most or all of surround formats 5.0, 5.1, 6.0, 6.1, 7.0 and 7.1 could be correctly replayed on the same four-line horizontal array, without the need to add more speakers or alter the positioning of speakers.

Another application for speaker line arrays is for game sound systems. For example, a horizontal four line array layout may be ideally suited for the realistic creation of all-round sound effects that track the on-screen action (whether on a television screen, flatscreen, or a computer screen).

Yet another application for speaker line arrays is in recording studios. For example, steerable speaker line arrays may be used to provide separate but equivalent beams to both the audio engineer responsible for mixing, and the customer who is normally seated at a different location in the recording studio. As with the home theater system, a single speaker layout (with four horizontal line arrays) can be used to emulate many other speaker configurations by software control. Different surround formats with varying numbers of replay channels or speakers can also be simulated with the line array speaker arrangement.

Yet another application for speaker line arrays is for sound reinforcement. The ability to control beam direction and width using the speaker line array and associated processing may be especially useful for sound reinforcement where intelligibility and coverage are needed under a variety of acoustic conditions. Such a technique may be used either indoors or outdoors.

In one aspect, according to certain embodiments as disclosed herein, a speaker unit is provided having a slim profile with integrated DSP and individual power amplifiers for each drive unit. In another separate aspect, a speaker unit is provided having audio beams which are steerable and/or expandable (or contractable) through software control, in real time or as pre-programmed in the source audio data, and providing the ability to partially or fully overlay multiple beams of different widths and having different audio content.

Various embodiments of slotted speaker units as described herein may provide a number of advantages, depending potentially upon the specific configuration, environment, and other factors. For example, a slotted speaker unit may have the effect of transforming an elliptical sound radiator (i.e., conventional conical speaker) and effectively transform it into, e.g., a rectangular or almost linear sound radiator, with excellent coverage at the radiated angles. In addition to sound quality, a slotted speaker unit may provide opportunity to improve the packaging and appearance of the speaker unit. Use of an output slot to radiate sound provides the opportunity for placing drive units closer to each other, reducing out-of-phase, cross-cancellation, and lobing effects that may otherwise occur from the use of multiple speakers.

In any of the foregoing embodiments, the audio source from which the various audio input signals are derived, before distribution to the speaker unit(s) or other system components as described herein, may comprise any audio work of any nature, such as, for example, a musical piece, a soundtrack to an audio-visual work (such as a DVD or other digitally recorded medium), or any other source or content having an audio component. The audio source may be read from a recorded medium, such as, e.g., a cassette, compact disc, CD-ROM, or DVD, or else may be received wirelessly, in any available format, from a broadcast or point-to-point transmission. The audio source may be in an encoded format, such as a surround sound or other multi-channel format, including Dolby-AC3, DTS, DVD-Audio, etc. The audio source may also comprise digital files stored, temporarily or permanently, in any format used for audio playback, such as, for example, an MP3 format or a digital multi-media format.

Unless otherwise specified, the various embodiments described herein can be implemented using either digital or analog techniques, or any combination thereof. The term "circuit" as used herein is meant broadly to encompass analog components, discrete digital components, microprocessor-based or digital signal processing (DSP), or any combination thereof. The invention is not to be limited by the particular manner in which the operations of the various sound processing embodiments are carried out.

While examples have been provided herein of certain preferred or exemplary sound processing characteristics, it will be understood that the particular characteristics of any of the system components may vary depending on the particular implementation, speaker type, relative speaker spacing, environmental conditions, and other such factors. Therefore, any specific characteristics provided herein are meant to be illustrative and not limiting. Moreover, certain components may be programmable so as to allow tailoring to suit individual sound taste.

While certain system components are described as being "connected" to one another, it should be understood that such language encompasses any type of communication or transference of data, whether or not the components are actually physically connected to one another, or else whether intervening elements are present. It will be understood that various additional circuit or system components may be added without departing from teachings provided herein.

In some of the embodiments described herein, the speakers utilized in the sound system may be passive or active in nature (i.e., with built-in or on-board amplification capability). In most or all of the embodiments, the various audio channels may be individually amplified, level-shifted, boosted, or otherwise conditioned appropriately for each individual drive unit or speaker unit.

While preferred embodiments of the invention have been described herein, many variations are possible which remain within the concept and scope of the invention. Such variations would become clear to one of ordinary skill in the art after inspection of the specification and the drawings. The invention therefore is not to be restricted except within the spirit and scope of any appended claims.

What is claimed is:

1. A speaker unit with integrated electronics for sound reproduction system, comprising:
   a first speaker line array and a second speaker line array, each speaker line array comprising a plurality of drive units arranged such that the drive units of the first speaker line array face an opposing direction from the drive units of the second speaker line array;
   a sound reflecting surface disposed in front of each drive unit, whereby acoustic output radiated from the drive unit is compressed and turned;
   one or more sound output slots for emanating sound from the drive units;
   a digital audio input signal from a remote source, said digital audio input signal comprising an audio source signal and digital control data for controlling characteristics of a sound beam radiated by the speaker unit;

a remote audio control unit that tracks excursions of the audio source signal and provides a variable-voltage power supply input signal, the variable-voltage power supply input signal is temporarily increased during a transient excursion of the audio source signal;

a low power cable connection for receiving the variable-voltage power supply input signal from the remote audio control unit, the average power of the variable-voltage power supply input signal being at a value such that the low power cable connection can be utilized;

a plurality of local amplifiers electronically coupled to the drive units in the speaker line arrays and collocated therewith, the local amplifiers receiving power from the variable-voltage power supply input signal;

a plurality of digital equalizers; and a digital receiver coupled to the digital audio input signal for providing individual audio signals derived from said audio source signal and control information to the digital equalizers derived from the digital control data, whereby the individual audio signals are modified in accordance with a Legendre shading function according to a relative position of the drive unit in the line array, the digital equalizers outputting modified audio signals to the plurality of local amplifiers based on the control information derived from the digital control data;

wherein the local amplifiers output amplified audio signals to the drive units in the speaker line arrays; and wherein the drive units in each of the speaker line arrays provide audio output in accordance with a said Legendre shading function.

2. A loudspeaker sound reproduction system with integrated electronics, comprising:

a common enclosure;

a plurality of drive units disposed in the common enclosure;

a plurality of local amplifiers disposed in the common enclosure, each of the drive units receiving an output from one of the local amplifiers;

a digital audio input signal from a remote source, said digital audio input signal comprising an audio source signal and digital control data for controlling output characteristics of the speaker unit;

a remote audio control unit that tracks excursions of the audio source signal and provides a variable-voltage power supply input signal, the variable-voltage power supply input signal is temporarily increased during a transient excursion of the audio source signal;

a low power cable connection input for receiving the variable-voltage power supply input signal via a low power cable from the remote audio control unit, the average power of the variable-voltage power supply input signal being at a value such that the low power cable connection can be utilized;

a plurality of digital equalizers disposed in the common enclosure; and a digital receiver disposed in the common enclosure and coupled to the digital audio input signal for providing individual audio signals derived from the audio source signal and control information derived from the digital control data to the digital equalizers, whereby the individual audio signals are being modified in accordance with the control information, the digital equalizers outputting modified audio signals to the plurality of local amplifiers;

wherein the local amplifiers output amplified audio signals to the drive units.

3. The loudspeaker sound reproduction system of claim 2, wherein the drive units are arranged in a linear array.

4. The loudspeaker sound reproduction system of claim 3, wherein the digital equalizers provide varying delays to the individual audio signals such the linear array of drive units simulates a curved line array shape.

5. The loudspeaker sound reproduction system of claim 4, wherein the digital equalizers provide Legendre shading for the individual audio signals.

6. The loudspeaker sound reproduction system of claim 3, wherein the digital equalizers provide varying delays to the individual audio signals to steer a direction of the acoustic output of the linear array of drive units as specified by the control information.

7. The loudspeaker sound reproduction system of claim 2, wherein the modified audio signals output by the digital equalizers are analog signals.

8. A sound reproduction system including an audio control unit coupled to one or more loudspeakers, said audio control unit comprising:

an input for receiving an external power signal;

an input for receiving an audio input signal representing audio content; and a digital processing system for generating a digital audio speaker output signal representing the audio content from the audio input signal and digital control data relating to reproduction of the audio content;

a power supply for generating a variable-voltage power supply signal tracking an output level of the audio content of the digital audio output signal, the variable-voltage power supply signal is temporarily increased during a transient excursion of the digital audio output signal; and at least one low power cable output connection for providing an the digital audio speaker output signal, the digital control data and a the variable-voltage power supply signal to an external speaker unit via at least one lower power cable, the average power of the variable-voltage power supply signal being at a value such that the low power cable output connection can be utilized;

wherein the at least one variable-voltage power supply signal is suitable for providing power to a local amplification system of the external speaker unit, and wherein the digital audio speaker signal is suitable for amplification by the local amplification system of the speaker unit according to the digital control data.

9. The sound reproduction system of claim 8, wherein the audio speaker output signal comprises digital audio data representing an audio signal to be reproduced and digital control data provides control information for steering or shading the audio signal using a plurality of drive units associated with the speaker unit.

10. The sound reproduction system of claim 8, wherein the digital audio speaker output signal and the variable-voltage power supply signal are contained in the same low power cable.

11. The sound reproduction system of claim 10, wherein said low power cable complies with ISO Category 5 (CAT5).

12. The sound reproduction system of claim 8, wherein:

the external speaker unit comprises at least one drive unit;

the speaker unit is operable to receive said at least one variable power supply signal and said digital audio speaker output signal from the audio control unit via said at least one low power cable;

the local amplification system is operable to be powered by the at least one variable power supply signal; and the local amplification system is further operable to amplify the audio content of the digital audio speaker output signal for the at least one drive unit.

13. The sound reproduction system of claim 12, wherein the speaker unit comprises a digital audio processor operable to receive and respond to the digital audio and control information from data and the digital audio speaker output signal conveyed over said low power cable from the audio control unit.

14. The sound reproduction system of claim 12, wherein the speaker unit comprises a plurality of drive units.

15. The sound reproduction system of claim 14, wherein the local amplification system provides a plurality of amplified audio output signals to the drive units, and wherein the digital audio processor is operable to adjust, or cause to be adjusted, a relative amplitude of the amplified output signal provided to each of said drive units according to a Legendre shading function.

16. The sound reproduction system of claim 14, wherein the digital audio processor is operable, in response to the digital information control data received over the at least one low power cable, to adjust or cause to be adjusted a direction or width of an audio beam output by the plurality of drive units by providing varying relative delays to audio output signals directed to the drive units.

17. The sound reproduction system of claim 14, wherein the plurality of drive units comprise at least one high-frequency drive unit and at least one mid-range drive unit, and wherein said local amplification system comprises a first amplifier for driving said at least one high-frequency drive unit and a second amplifier for driving said at least one mid-range drive unit.

18. The sound reproduction system of any of claim 14, wherein said local amplification system and said plurality of drive units are housed in a common enclosure separate from said audio control unit.

19. The sound reproduction system of claim 12, wherein said at least one variable power supply signal includes a variable positive power supply signal and a variable negative power supply signal; and wherein the variable positive and negative power supply signals are operable to provide power to the local amplification system of the speaker unit.

20. The sound reproduction system of claim 12, further comprising a second speaker unit comprising a second local amplification system and at least one drive unit, wherein the second speaker unit is operable to receive a second variable power supply signal and a second digital audio speaker output signal from the audio control unit via a second low power cable, the second digital audio speaker output signal representing the audio content from the audio input signal and second digital control data relating to reproduction of the audio content, wherein the second local amplification system of the second speaker unit is operable to be powered by the second variable power supply signal, and wherein the local amplification system is further operable to amplify the second audio speaker output signal for the at least one drive unit of the second speaker unit.

21. A sound reproduction system including a speaker unit coupled to a remote audio control unit, the speaker unit comprising:

at least one drive unit within a speaker enclosure;

a local amplification system within the speaker enclosure;

a digital audio input signal received from the remote audio control unit, said digital audio input signal comprising an audio source signal and digital control information for controlling output characteristics of the speaker unit;

a remote audio control unit that tracks excursions of the audio source signal and provides a variable-voltage power supply input signal, the variable-voltage power supply input signal is temporarily increased during a transient excursion of the audio source signal;

a low power cable connection for receiving at least one variable-voltage power supply input signal from the remote audio control unit, the average power of the variable-voltage power supply input signal being at a value such that the low power cable connection can be utilized; and, wherein the local amplification system is operable to be powered by the at least one variable-voltage power supply signal, and to amplify the audio source signal of the digital audio input signal for the at least one drive unit according to the digital control information.

22. The sound reproduction system of claim 21, wherein the speaker unit comprises a digital audio processor operable to receive the digital control information from the digital audio input signal over said low power cable from the remote audio control unit.

23. The sound reproduction system of claim 22, wherein the digital audio processor is operable to adjust a volume of and/or to delay the audio input signal in response to the digital control information received from the audio control unit.

24. The sound reproduction system of claim 22, wherein said speaker unit comprises a plurality of drive units disposed within the speaker enclosure and arranged in a linear array.

25. The sound reproduction system of claim 24, wherein the local amplification system provides a plurality of amplified audio output signals to the drive units, and wherein the digital audio processor is operable to adjust, or cause to be adjusted, a relative amplitude of the amplified audio output signals provided to each of said drive units according to a Legendre shading function.

26. The sound reproduction system of claim 25, wherein the digital audio processor is operable, in response to the digital control information, to adjust a direction or width of an audio beam output by the plurality of drive units by varying relative delays for the amplified audio output signals provided to the drive units.

27. The sound reproduction system of claim 24, wherein the plurality of drive units comprise at least one high-frequency drive unit and at least one mid-range drive unit, and wherein said local amplification system comprises a first amplifier for driving said at least one high-frequency drive unit and a second amplifier for driving said at least one mid-range drive unit.

28. The sound reproduction system of claim 24, wherein:
said local amplification system comprises a plurality of local amplifiers coupled to the drive units and receiving power from the variable-voltage power supply input signal;

the speaker unit further comprises a plurality of digital equalizers; and the digital audio processor is configured to provide individual audio signals and said control information to the digital equalizers based on the digital audio input signal, whereby said digital equalizers being configured to shade and/or steer the individual audio signals are shaded and/or steered according to the digital control information, the digital equalizers outputting modified audio signals to the plurality of local amplifiers.

29. The sound reproduction system of claim 21, wherein said at least one variable power supply signal includes a variable positive power supply signal and a variable negative power supply signal; and wherein the variable positive and negative power supply signals are operable to provide power to the local amplification system.

30. The sound reproduction system of claim 21, wherein the digital audio input signal and the variable-voltage power supply signal are contained in the same low power cable.

31. The sound reproduction system of claim 30, wherein said low power cable complies with ISO Category 5 (CAT5).

32. A method for sound reproduction system with an audio control unit coupled to one or more loudspeakers remote therefrom, said method comprising:

receiving an external power signal at the audio control unit;
receiving an audio input signal at the audio control unit; and
providing a digital audio speaker output signal and a variable-voltage power supply signal to a speaker unit via at least one low power cable, the digital audio speaker output signal comprising digital audio data representing an audio signal to be reproduced and digital control information for steering or shading the audio signal using a plurality of drive units associated with the speaker unit, the variable-voltage power supply signal is temporarily increased during a transient excursion of the audio signal, the average power of the variable-voltage power supply signal being at a value such that the low power cable can be utilized;
providing power to a local amplification system of the speaker unit from the at least one variable power supply signal; and
amplifying the audio signal with the local amplification system of the speaker unit.

33. The method of claim 32, wherein the audio speaker output signal and the variable-voltage power supply signal are contained in the same low power cable.

34. The method of claim 33, wherein said low power cable complies with ISO Category 5 (CAT5).

35. The method of claim 32, further comprising adjusting a direction or width of an audio beam output by the drive units by providing varying relative delays to audio output signals directed to the drive units.

36. The method of claim 32, wherein the plurality of drive units comprise at least one high-frequency drive unit and at least one mid-range drive unit, and wherein said local amplification system comprises a first amplifier for driving said at least one high-frequency drive unit and a second amplifier for driving said at least one mid-range drive unit.

37. The method of claim 32, wherein said at least one variable power supply signal includes a variable positive power supply signal and a variable negative power supply signal, the method further comprising providing power to the local amplification system of the speaker unit from the variable positive and negative power supply signals.

* * * * *